US008269981B1

(12) United States Patent
Doerband et al.

(10) Patent No.: US 8,269,981 B1
(45) Date of Patent: Sep. 18, 2012

(54) METHOD AND AN APPARATUS FOR MEASURING A DEVIATION OF AN OPTICAL TEST SURFACE FROM A TARGET SHAPE

(75) Inventors: Bernd Doerband, Aalen (DE); Frank Riepenhausen, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 595 days.

(21) Appl. No.: 12/414,390

(22) Filed: Mar. 30, 2009

(51) Int. Cl.
    *G01B 11/02* (2006.01)
(52) U.S. Cl. .................................. 356/512; 359/838
(58) Field of Classification Search .......... 356/512–515; 359/838
    See application file for complete search history.

(56) References Cited

U.S. PATENT DOCUMENTS

| 7,118,449 | B1 * | 10/2006 | Dinger et al. ................... 451/6 |
| 7,327,469 | B2   | 2/2008  | Deck |
| 7,348,565 | B2   | 3/2008  | Mann et al. |
| 7,405,833 | B2 * | 7/2008  | Smythe et al. ................ 356/514 |
| 7,414,781 | B2   | 8/2008  | Mann et al. |
| 2006/0221348 | A1 * | 10/2006 | Deck ............................ 356/511 |
| 2006/0280424 | A1 * | 12/2006 | Urakawa ..................... 385/147 |
| 2008/0165426 | A1   | 7/2008  | Schuster |
| 2009/0128829 | A1   | 5/2009  | Schillke et al. |

FOREIGN PATENT DOCUMENTS

| WO | 2006/077145 A2 | 7/2006 |
| WO | 2006/119977 A1 | 11/2006 |
| WO | 2007/020004 A1 | 2/2007 |
| WO | 2008/012091 A2 | 1/2008 |
| WO | 2009/006919 A1 | 1/2009 |
| WO | 2009/007087 A1 | 1/2009 |

OTHER PUBLICATIONS

Peter de Groot, "Grating interferometer for flatness testing", Feb. 1, 1996, Optics Letters, vol. 21, No. 3, p. 228-230.*
Gardner et al., "Retrace error evaluation on a figure-measuring interferometer," Proceedings of SPIE, vol. 5869 (2005), p. 217-224.
Gappinger et al., "Iterative Reverse Optimization Procedure for Calibration of Aspeheric EWave-Front Measurements on a Nonnull Interferometer", Applied Optics IP, vol. 43, Issue 27, p. 5152-5161.
Daniel Malacara, "Optical Shop Testing", Chapter 12, 2nd edition, Wiley interscience Publication (1992).

* cited by examiner

*Primary Examiner* — Tarifur Chowdhury
*Assistant Examiner* — Jonathan Hansen
(74) *Attorney, Agent, or Firm* — Sughrue Mion, PLLC

(57) ABSTRACT

A method of measuring a deviation of an optical test surface from a target shape is provided. The method includes directing an incoming beam of electromagnetic radiation onto the test surface to generate a measuring beam that has interacted with the test surface, causing the ray that has interacted with the test surface to pass through an interferometer on a deviated path, performing an interferometric measurement by superimposing a reference beam with the measuring beam to determine a wave front deviation of the measuring beam from the reference beam, determining a retrace error in the wave front deviation, and correcting the measured wave front deviation by eliminating the retrace error therefrom. The differences in aberrations accumulated by the ray having traveled on the deviated path from fictitious aberrations that would have been accumulated by a ray that had traveled on an undeviated path cause the retrace error.

26 Claims, 8 Drawing Sheets

METHOD AND AN APPARATUS FOR MEASURING A DEVIATION OF AN OPTICAL TEST SURFACE FROM A TARGET SHAPE

BACKGROUND OF THE INVENTION

1. Field of the Invention

Apparatuses and methods consistent with the present invention relate to determining a deviation of an optical test surface from a target shape using an interferometer. Apparatuses and methods consistent with the present invention also relate to measuring a local distribution of an optical property over an optically effective area of an optical test object using an interferometer. In addition, apparatuses and methods consistent with the present invention relate to producing an optical element, the optical element itself, imaging optics comprising the optical element, and a projection exposure tool.

2. Description of the Related Art

An example of an interferometric apparatus of the type used is described e.g. in WO 2006/077145 A2. This apparatus comprises an interferometer for producing an incoming beam, the wave front of which is hereupon adapted to the desired shape of the optical surface. The wave front of the adapted incoming beam is analyzed interferometrically after reflection at the optical surface, and the deviation of the actual shape of the optical surface from the target shape of the latter is thus determined.

The optical element comprising the optical test surface is, for example, an optical component such as a lens or a mirror. These types of optical components are used in optical systems, such as telescopes used in astronomy, or in imaging systems as used in lithographic processes. The success of this type of optical system is substantially determined by the precision with which the optical components of the latter can be produced and then be processed, such that the surface shapes of the latter respectively correspond to a target shape which was specified by a designer of the optical system when designing the latter. Within the framework of this type of production it is necessary to compare the shape of the processed optical surfaces with the target shape of the latter, and to determine any differences and deviations between the finished surface and the desired surface. The optical surface can then be processed in those regions where differences between the processed surface and the desired surface exceed, for example, pre-specified threshold values.

Generally, interferometers are used for very high precision measurements on optical surfaces. A related art interferometer arrangement for measuring an optical surface typically comprises a coherent light source and interferometer optics in order to produce an incoming light beam which strikes the surface to be measured such that wave fronts of the incoming beam have at locations of the surface to be measured respectively a same shape as the target shape of the surface to be measured. In this type of situation the light of the incoming beam strikes each location of the surface being measured essentially orthogonally and is then reflected back from the latter in itself. The reflected back light is then overlaid with reference light which has been reflected by a reference surface. Deviations between the shape of the surface measured and its target shape can then be established from interference thus produced.

Whereas spherical wave fronts can be produced for measuring spherical optical surfaces with a relatively high degree of precision by using related art interferometer optics, advanced techniques are required in order to produce incoming beams the wave fronts of which are aspherical so that the light at each location of an aspherical optical surface to be measured strikes the latter orthogonally. In order to produce these types of incoming light, beam optics are used which are called zero lenses, K systems or compensators. Background information with regard to these zero lenses or compensators can be found in Chapter 12 of the text book by Daniel Malacara, Optical Shop Testing, $2^{nd}$ edition, Wiley interscience Publication (1992).

The precision of deviation measurements achieved by current systems is often not satisfactory considering the tight tolerances required for high quality optics, in particular in a case in which the target shape of the test surface deviates from rotational symmetry.

SUMMARY OF THE INVENTION

It is an object of the invention to provide a method and an apparatus for measuring a deviation of an optical surface from a target shape with improved precision.

The present invention provides a method of measuring a deviation of an optical test surface from a target shape. The method comprises directing an incoming beam of electromagnetic radiation having a wavelength $\lambda$ onto the test surface to generate a measuring beam having interacted with the test surface, and performing a use measurement by an interferometer by superimposing a reference beam with the measuring beam to determine a wave front deviation of the measuring beam from the reference beam. The optical test surface is configured such that a wave front deviation of larger than $10*\lambda$ is obtained when performing the interferometric measurement in optimum alignment, in which the test surface and optical components of the interferometer are aligned such that the wave front deviation is minimized. Aberrations accumulated by the measuring beam in the interferometer during the use measurement differ from fictitious aberrations which would have been accumulated by the measuring beam in case of the optical test surface being configured such that the wave front deviation obtained in optimum alignment is smaller than $\lambda$. The difference in the accumulated aberrations, i.e. the aberrations accumulated by the measurement beam during the use measurement and the fictitious aberrations, cause a retrace error in the wave front deviation. The method further comprises the steps of determining the retrace error, and correcting the wave front deviation of the use measurement by eliminating the retrace error therefrom.

The present invention also provides an apparatus for measuring a deviation of an optical test surface from a target shape. The apparatus comprises an interferometer having a measurement arm configured to direct an incoming beam of electromagnetic radiation onto the test surface to generate a measuring beam having interacted with the test surface. The interferometer is configured to perform an interferometric use measurement by superimposing a reference beam with the measuring beam to determine a wave front deviation of the measuring beam from the reference beam. The measuring apparatus further comprises an evaluation device configured to determine a retrace error and to correct the measured wave front deviation by eliminating the retrace error therefrom. The retrace error is generated if the optical test surface is configured such that a wave front deviation of larger than $10*\lambda$ is obtained when performing the interferometric measurement in optimum alignment. In optimum alignment the test surface and optical components of the interferometer are aligned such that the wave front deviation is minimized. Aberrations accumulated by the measuring beam in the interferometer during the use measurement differ from fictitious aberrations which would have been accumulated by the measuring beam in case of the optical test surface being configured such that the wave front deviation obtained in optimum alignment is smaller than λ. The difference in the accumulated aberrations causes the retrace error in the wave front deviation.

Typically, before operation of the interferometer, the interferometer is calibrated using a rotationally symmetric calibration surface. During this calibration all single rays of the incoming beam impinge substantially perpendiculary onto the calibration surface. The ray paths during this calibration essentially correspond to the paths of the rays constituting the measuring beam in case of the optical test surface being configured such that the wave front deviation obtained in optimum alignment is smaller than the wavelength λ.

However, the above calibration is not completely accurate for the measurement of the test surface, which is configured such that the measurement results in a wave front deviation of larger than 10 times the wavelength λ of the measuring radiation, even if the interferometer and the test surface are in optimum alignment. In case of non optimum alignment the wave front deviation will be even larger. This configuration of the test surface causes at least one ray of the measurement beam to travel on a deviated path as compared to the path during the calibration measurement. This effect leads to a retrace error in the measured wave front deviation. These retrace errors are eliminated from the measurement, resulting in an improved measurement precision of the shape of the test surface. The measuring radiation can have a monochromatic wavelength spectrum. In this case the wavelength λ may be the average wavelength of the monochromatic wavelength spectrum. In case the measuring radiation comprises a multiline spectrum the wavelength λ may be the wavelength of the line in the spectrum having the largest intensity.

Exemplary embodiments of the invention allow for the measurement of so-called nano free form surfaces, which are characterized in that their target shape deviates from rotational symmetry, as explained in more detail later, using an interferometer having an incoming beam adapted to a rotationally symmetrical target shape. In this case the rays of the measurement beam travel on a significantly deviated path leading to large retrace errors. The correction of the retrace errors allows the shape measurement of such nano free form surfaces with a high precision. Exemplary embodiments of the invention further allow for the use of a turn averaging technique, in which the test surface is arranged in several rotational positions with respect to the axis of symmetry of the associated rotationally symmetric shape, and measurements are made for each of the rotational positions.

In some exemplary embodiments according to the invention the interferometer is calibrated using a rotationally symmetric calibration surface, which is configured such that all single rays of the incoming beam impinge perpendicularly onto the calibration surface. In this calibration the aberrations accumulated by the rays travelling on their undeviated path are determined. This calibration data, however, is not accurate due to the retrace errors. The correction of the wave front deviation by eliminating the retrace error can be considered an "adjustment" of the calibration data. According to one variation the calibration surface has an aspherical shape. Alternatively the calibration surface can also have a spherical or a plane shape.

In certain exemplary embodiments according to the invention the target shape has a deviation z from a rotationallysymmetric calibration surface in the direction of an axis of symmetry of the calibration surface, wherein $$\frac{\partial z}{\partial x_i} < 0.5 \cdot N \cdot \lambda / D,$$

with $x_i$ being any dimension perpendicular to the axis of symmetry, N being the number of pixels along a dimension of a camera of the interferometer available to record an interferogram generated by the reference beam and the measuring beam having interacted with the test surface having a diameter D perpendicular to the axis of symmetry, and λ being the wavelength of the electromagnetic radiation. A test surface having such a target shape is herein referred to as nano free form surface, which was already mentioned above. Nano free form surfaces are considered surfaces whose deviation from the rotational symmetry does not exceed a level, which is defined by the measuring dynamics of the interferometer as detailed above. Typical values for the parameters N and λ are: 500≦N≦2000, 10 mm≦D≦600 mm. Examples for the wavelength λ are 632.8 nm and 532 nm. Therefore, according to exemplary embodiments of the invention, $\partial z/\partial x_i$ is in one variation smaller than 0.06, in particular smaller than 0.03 or smaller than 0.0002. Accordingly the rays of the incoming beam impinge onto the test surface at angles deviating from 90° in one exemplary embodiment by less than 3°, in another embodiment by less than 1°, and in a further embodiment by less than 0.01°.

In some exemplary embodiments according to the invention the target shape has a deviation z from a rotationally symmetric calibration surface in the direction of an axis of symmetry of the calibration surface, wherein $$\frac{\partial z}{\partial x_i} > 0.002 \cdot N \cdot \lambda / D,$$

with $x_i$ being any dimension perpendicular to the axis of symmetry, N being the number of pixels along a dimension of a camera of the interferometer available to record an interferogram generated by the reference beam and the measuring beam having interacted with the test surface having a diameter D perpendicular to the axis of symmetry, and λ being the wavelength of the electromagnetic radiation. According to one exemplary embodiment $\partial z/\partial x_i$ is larger than 0.0002, according to further embodiments larger than 0.0001, and larger than $8 \cdot 10^{-7}$. Accordingly the rays of the incoming beam impinge onto the test surface at angles deviating from 90° in one exemplary embodiment by more than 0.01°, in another embodiment by more than 0.007°, and in a further exemplary embodiment by more than 0.00005°.

In certain exemplary embodiments according to the invention the target shape has a deviation z from a rotationally symmetric calibration surface in the direction of an axis of symmetry of the calibration surface and gradient differences $g_x$ and $g_y$ are defined as follows:

$$g_x = \max\left(\frac{\partial z}{\partial x}\right)_j - \min\left(\frac{\partial z}{\partial x}\right)_j, \text{ and } g_y = \max\left(\frac{\partial z}{\partial y}\right)_j - \min\left(\frac{\partial z}{\partial y}\right)_j$$

with x and y being orthogonal dimensions perpendicular to the axis of symmetry and j signifying the pixels on the target shape, wherein the target shape of the optical test surface fulfills the following conditions:

$$g_x < 0.5 \cdot N \cdot \lambda/D \text{ and } g_y < 0.5 \cdot N \cdot \lambda/D$$

and further $$g_x > 0.002 \cdot N \cdot \lambda/D \text{ and/or } g_y > 0.002 \cdot N \cdot \lambda/D,$$

with N being the number of pixels along a dimension of a camera of the interferometer available to record an interferogram generated by the reference beam and the measuring beam having interacted with the test surface having a diameter D perpendicular to the axis of symmetry, and λ being the wavelength of the electromagnetic radiation. That means $g_x$ and $g_y$ are each smaller than $0.5 \cdot N \cdot \lambda/D$ and either $g_x$ or $g_y$ is larger than $0.002 \cdot N \cdot \lambda/D$ or both $g_x$ and $g_y$ are larger than $0.002 \cdot N \cdot \lambda/D$. According to an exemplary embodiment $g_x$ and $g_y$ are each smaller than 0.03 and at least one of $g_x$ and $g_y$ is larger than 0.0001.

In some exemplary embodiments according to the invention the incoming beam is directed onto a calibration surface and a resulting wave front deviation is measured by the interferometer for each of two different tilt positions of the calibration surface and a long range retrace parameter G of the interferometer is established from the following formula:

$$G = \Delta W/\Delta \epsilon,$$

with ΔW being the difference between the measured wave front deviations for the two different tilt positions and Δε being the tilt angle between the two different tilt positions, and the retrace error is determined by multiplying the long range retrace parameter G with a local tilt of the test surface at the location at which the ray has interacted with the test surface, which local tilt is determined from a corresponding local fringe density of the wave front deviation measured for the test surface. The above long range retrace parameter G allows the determination of retrace errors, which are predominantly made up from so-called long range retrace errors.

In certain exemplary embodiments according to the invention at least one ray of the measuring beam passes through the interferometer on a deviated path, which is deviated with respect to the path taken by the ray in case of the optical surface being configured such that the wavefront deviation obtained in optimum alignment is smaller than λ, the wave front deviation measured for the test surface is a two dimensional distribution of the wave front deviation in a plane perpendicular to the propagation direction of the measuring beam, the measuring beam interacts with several optical surfaces of the interferometer, each of which surfaces adds to the aberrations accumulated by the ray, and a distance between the location, at which the ray travelling on the deviated path through the interferometer impinges on one of the optical interferometer surfaces and the location, at which the ray would impinge if travelling on the respective undeviated path, is for each of the interferometer surfaces smaller than a minimum spatial cycle of the retrace error in the two dimensional wave front deviation distribution. The minimum spatial cycle can be determined by performing a Fourier transformation on the wave front deviation distribution and picking the wavelength corresponding to the largest frequency having a significant intensity. In this context a significant intensity is an intensity of larger than 1%, in particular larger than 5% of the maximum intensity. A retrace error fulfilling the above specification is considered a long range retrace error. As already indicated above, such a long range retrace error can be represented by a differential quotient. Long range retrace errors are in particular retrace errors of spatial cycles in the range between 1 mm and the diameter D of the test surface.

In some exemplary embodiments according to the invention the measuring beam interacts with $S_N$ optical surfaces of the interferometer, each of which optical surfaces adding to the aberrations accumulated by the measuring beam, the test surface is consecutively arranged in M different tilt positions with M>$S_N$, the resulting wave front distribution is measured for each tilt position and the respective contributions of the single optical surfaces to the retrace error are calculated. From the respective contributions the total retrace error can be calculated. The above algorithm allows the determination of retrace errors, which are predominantly made up from so-called short range retrace errors.

In some exemplary embodiments according to the invention at least one ray of the measuring beam passes through the interferometer on a deviated path, which is deviated with respect to the path taken by the ray in case of the optical surface being configured such that the wavefront deviation obtained in optimum alignment is smaller than λ, the wave front deviation measured for the test surface is a two dimensional distribution of the wave front deviation in a plane perpendicular to the propagation direction of the measuring beam, and a distance between the location, at which the ray travelling on the deviated path through the interferometer impinges on one of the optical interferometer surfaces and the location, at which the ray would impinge if travelling on the respective undeviated path, is for each of the interferometer surfaces larger than a minimum spatial cycle of the retrace error introduced into the two dimensional wave front deviation distribution. A retrace error fulfilling the above specification is considered a short range retrace error. As already indicated above the determination of such a short range retrace error cannot be represented by a differential quotient, but requires the knowledge of the contributions of the single optical surfaces in the interferometer. The main cause of short range retrace errors are fine surface structures, like scratches, surface defects and dust particles, on the optical surfaces of the interferometer. Short range retrace errors are in particular retrace errors of spatial cycles below 1 mm, especially below 500 μm or below 100 μm, and above 1 μm, especially above 5 μm or above 10 μm. Spatial cycles of a retrace error in this context are "wavelengths" having a significant intensity in the above sense, which "wavelengths" are obtained by performing a Fourier transformation on the wave front deviation distribution. Short range retrace errors can also be referred to as strongly varying retrace errors.

In certain exemplary embodiments according to the invention the retrace error comprises a spatial cycle of less than 1 mm, in particular less than 500 μm or less than 100 μm. According to one variation the retrace error comprises spatial cycles exclusively in the range between 5 μm and 1 mm, in particular the range between 5 μm and 500 μm. As explained above, such a retrace error is caused by fine surface structures on the optical surfaces of the interferometer in contrast to a so-called long range retrace error, which can be caused by a misalignment of the optical components within the interferometer or a misalignment of the test surface with respect to the interferometer or by a non-perfect design of the interferometer components.

In some exemplary embodiments according to the invention the reference beam is split off the incoming beam in the interferometer, the remaining portion of the incoming beam travels through a measuring arm of the interferometer before interacting with the test surface and the measuring beam travels in the optical path of the incoming beam back through the measuring arm of the interferometer and travels in the same optical path as the reference beam in the interferometer to form an interferogram on an interferometer camera.

In certain exemplary embodiments according to the invention the optical test surface is a lens surface or a mirror surface, in particular for microlithography. According to one variation the optical test surface is the optical surface of an optical element for use in a projection objective of a projection exposure tool for microlithography. The method and the apparatus according to exemplary embodiments of the invention are also suitable to measure lens systems, mirror systems or hybrid systems comprising lens elements and mirror elements.

In certain exemplary embodiments according to the invention the deviation of the optical test surface from the target shape is measured with an accuracy of less than 1 nm, i.e. with an accuracy of better than 1 nm. According to variations the deviation is measured with an accuracy of less than 0.5 nm or less than 0.1 nm. This high level of accuracy is achieved due to the correction of the retrace error according to exemplary embodiments of the invention.

Further, according to exemplary embodiments of the invention, the above measurement method is used for obtaining an optical element having an optical surface manufactured very closely to its target shape. Thereby the deviation of the optical surface from the target shape is determined using the inventive method and the optical surface is mechanically processed in order to eliminate the determined deviation.

Further, according to exemplary embodiments of the invention, an optical element having an optical surface is provided. The optical surface has a target shape, which is configured as a free form surface and cannot be described by a rotationally symmetrical function. The target shape deviates from its best fitting rotationally symmetrical surface, in particular its best fitting aspherical surface, such that a normal on each target shape element, also referred to as free form surface element, of a utilized area of the free form surface, which is configured for guiding radiation, in particular imaging radiation, and a normal onto the respective corresponding asphere surface element of the aspherical surface enclose an angle of maximum 70 μrad. The optical surface deviates from the target shape by less than 1 nm, in particular less than 0.5 nm or less than 0.1 nm. According to certain exemplary embodiments the maximum angular deviation between the normals may be smaller than 50 μrad, smaller than 35 gad or even smaller.

Such an optical element may be produced by performing the measuring method according to exemplary embodiments of the invention, in which the wave front deviation is corrected by eliminating the retrace error therefrom, and mechanically processing the optical surface of the optical element in order to eliminate the determined deviation. Subsequently the obtained surface may be measured again to evaluate the quality of the mechanical processing. Mechanical processing and measurement can be repeated as long as it is required to obtain the optical surface with the desired accuracy with respect to its target shape.

In some exemplary embodiments according to the invention the optical element is configured as a mirror and the optical surface is a reflective surface of the mirror. As an example the reflective surface may be configured to reflect radiation in the EUV-wavelength range. In an alternative exemplary embodiment the optical element may be configured as a lens.

In certain exemplary embodiments according to the invention the target shape deviates from the best fitting rotationally symmetrical surface, in particular the best fitting aspherical surface, by more than the wavelength of the radiation, in particular the imaging radiation, which the optical element is configured for.

In some exemplary embodiments according to the invention the optical element is configured for use in a microlithography projection exposure tool, in particular a projection objective of a microlithography exposure tool. In another variation the optical element can be configured for use in a telescope.

Further, according to exemplary embodiments of the invention, imaging optics are provided comprising the above optical element, wherein the imaging optics is configured as a projection objective for microlithography. In one variation the optical surface of the optical element is configured as a static free form surface. A static free form surface is a free form surface, which is not actively modified in its shape during the projection operation in the projection objective.

Further, according to exemplary embodiments of the invention, a projection exposure tool for microlighography is provided. The projection exposure tool comprises the above imaging optics, a radiation source for generating the radiation, in particular the imaging radiation, and illumination optics for guiding the radiation onto an object field of the imaging optics.

Further according to exemplary embodiments of the invention, a method of measuring a local distribution of an optical property over an optically effective area of an optical test object using an interferometer is provided. The method comprises the step of directing an incoming beam of electromagnetic radiation onto the test object to generate a measuring beam having interacted with the test object. The interaction with the test object causes the cross-sectional intensity distribution of the beam to be altered. The method further comprises the step of performing an interferometric measurement by superimposing a reference beam with the measuring beam to determine a wave front deviation of the measuring beam from the reference beam. Aberrations accumulated by the measuring beam having travelled through the interferometer differ from fictitious aberrations, which would have been accumulated by the measuring beam in case of the cross-sectional intensity distribution remaining unaltered by the interaction with the test object, wherein the difference in the accumulated aberrations causes an error in the wave front deviation. According to the method further the error is determined and the local distribution of the optical property is determined over the optically effective area of the test object taking the error into account. Features contained in exemplary embodiments regarding the method according to which the retrace error is eliminated from the measured wave front deviation can be applied to the current method where suitable.

The local distribution of the optical property over the optically effective area in this context does not comprise a deviation of an optical test surface from a target shape. The method of measuring the local distribution of an optical property of an optical test object therefore is not adapted to measure a deviation of an optical surface of the test object from a target shape.

According to exemplary embodiments of the invention, a further apparatus for measuring a local distribution of an optical property over an optically effective area of an optical test object is provided. The apparatus comprises an interferometer having a measurement arm configured to direct an incoming beam of electromagnetic radiation onto the test object to generate a measuring beam having interacted with the test object, which interferometer is configured to perform an interferometric measurement by superimposing a reference beam with the measuring beam to determine a wave front deviation of the measuring beam from the reference beam. Further, the interferometer comprises an evaluation device configured to determine an error in the wave front deviation. The error is caused due to the cross-sectional intensity distribution of the incoming beam being altered when interacting with the test object. This causes aberrations accumulated by the measurement beam having travelled through the interferometer to differ from fictitious aberrations, which would have been accumulated by the measurement beam in case of the cross-sectional intensity distribution remaining unaltered during the interaction of the input beam with the test object. The difference in the accumulated aberrations causes the error in the wave front deviation. The evaluation device is further configured to determine the local distribution of the optical property over the optically effective area of the test object taking the error into account.

According to an exemplary embodiment the optical property is the refractive index of the optical test object. According to another exemplary embodiment the optical property is a transmission or a reflection property of the optical test object. Surface defects, scratches and/or dirt patches on a surface of the test object can be localized by evaluating the measured local distribution of the optical property. Further the optical property can be a polarization property of a surface of the test object.

According to exemplary embodiments of the invention, a further method of measuring a deviation of an optical test surface from a target shape is provided. This method comprises the steps of: directing an incoming beam of electromagnetic radiation onto the test surface to generate a reflected measuring beam, performing a measurement using an interferometer by superimposing a reference beam with the measuring beam to determine a wave front deviation of the measuring beam from the reference beam, determining a retrace error of the wave front deviation, which retrace error is caused by a difference between aberrations accumulated by the measuring beam in the interferometer, with the test surface and the optical components of the interferometer being aligned, and aberrations accumulated by the measuring beam in the interferometer in case the measuring beam is generated by reflection of the incoming beam at the test surface into itself, and correcting the wave front deviation of the interferometric measurement by eliminating the retrace error therefrom. The test surface and the optical components of the interferometer being aligned in the above context may encompass an alignment such that the test surface and the optical components are in optimum alignment for the interferometric measurement. In this optimum alignment the wave front deviation is minimized. The alignment may further be performed such that the wave front deviation obtained when measuring a test surface having the shape of the wavefront of the reference beam is smaller than the wavelength $\lambda$, of the electromagnetic radiation, in particular smaller than $0.1\lambda$. In other words the wavefront deviation caused by a misalignment of the interferometer and/or the test surface is smaller than $\lambda$ or $0.1\lambda$. Further exemplary embodiments of this measuring method may comprise features of the measuring methods and measuring apparatuses described above.

The features contained in above described exemplary embodiments of the method according to the invention can be transferred to the apparatus according to the invention and vice versa. The exemplary embodiments of the apparatus resulting therefrom shall therefore explicitly be covered by the disclosure of this invention.

BRIEF DESCRIPTION OF THE DRAWINGS

The foregoing, as well as other aspects of the invention, will be more apparent from the following detailed description of exemplary embodiments of the invention with reference to the following diagrammatic drawings, wherein.

DETAILED DESCRIPTION OF EXEMPLARY EMBODIMENTS OF THE PRESENT INVENTION

Figure 1:
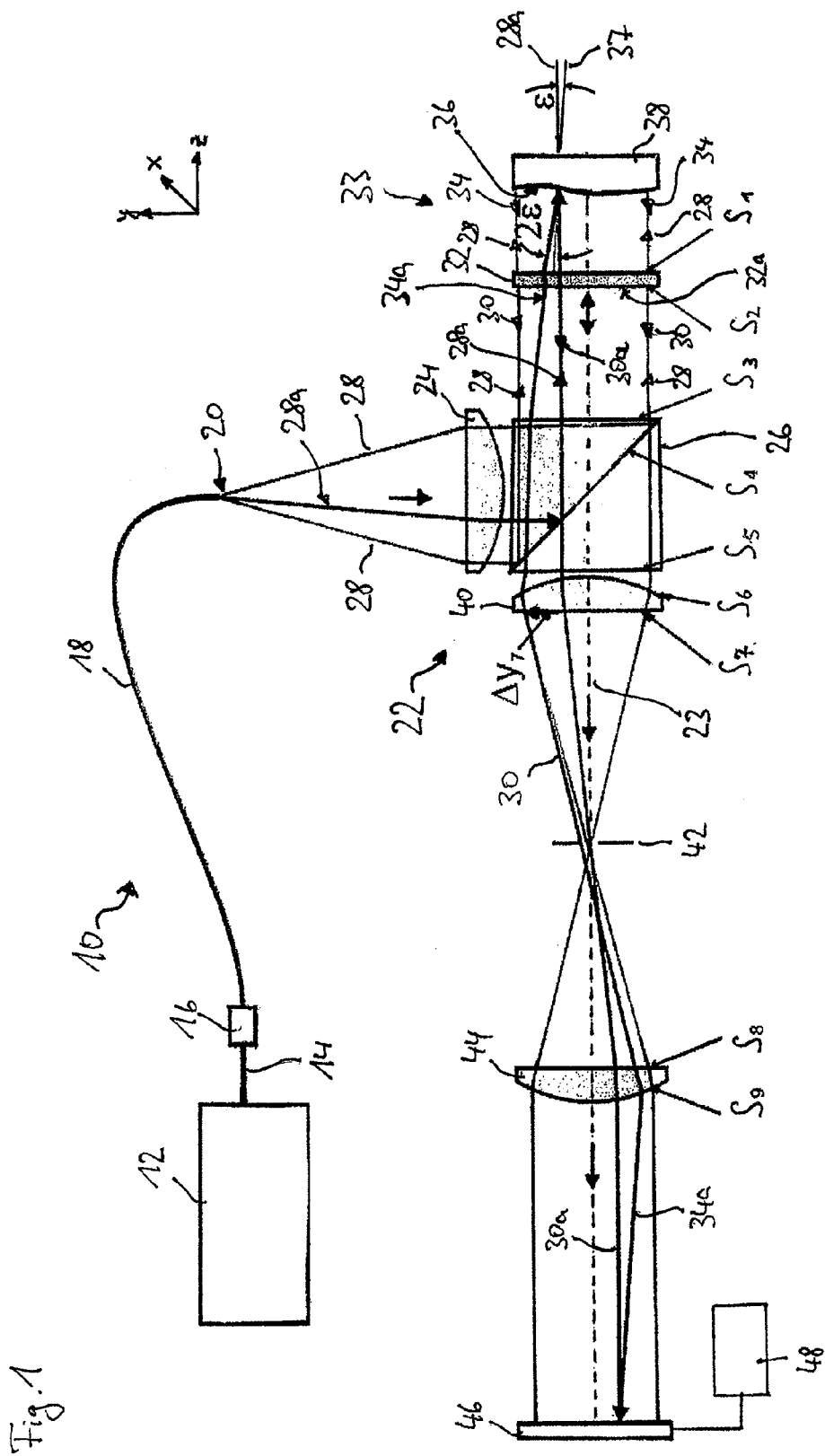
FIG. 1 illustrates a measuring apparatus for interferometrically measuring a deviation of an optical surface from a target shape according to an exemplary embodiment of the invention.

In the exemplary embodiments of the invention described below, components that are alike in function and structure are designated as far as possible by the same or like reference numerals. Therefore, to understand the features of the individual components of a specific exemplary embodiment, the descriptions of other exemplary embodiments or the summary of the invention should be referred to.

FIG. 1 illustrates an interferometric measuring apparatus 10 of an exemplary embodiment according to the invention. The measuring apparatus 10 is suitable for determining a deviation of an optical test surface 36 from a target shape of a test object 38. The test object 38 can for example be in the form of an optical lens or a mirror for a projection objective of a projection exposure tool for microlithography. The test object 38 is mounted by a holder not shown in the drawings.

The interferometric measuring apparatus 10 comprises a radiation source 12, an interferometer 22 and an evaluation device 48. The radiation source 12 produces electromagnetic radiation 14 and for this purpose comprises a laser, such as a helium-neon laser for producing a laser beam. The electromagnetic radiation 14 comprises sufficiently coherent radiation in order to perform an interferometric measurement. In the case of a helium-neon laser the wavelength of the electromagnetic radiation 14 is approximately 633 nm. However, the wavelength of the radiation 14 can also have other wavelengths in the visible and non-visible wavelength range.

The laser beam of electromagnetic radiation 14 is directed onto a laser-fiber interface 16 by which the radiation 14 is fed into a single-mode optical fiber 18. The fiber exit 20 is arranged in a focus point of a collimator 24 of the interferometer 22. The radiation 14 exiting the fiber 18, from here on referred to as incoming beam 28, is therefore converted by the collimator into a plane wave. The incoming beam 28 configured as a plane wave is suitable for measuring a test surface 36 having a plane target shape. However, a plane shape is only one example for the target shape to be tested according to exemplary embodiments of the invention. Other target shapes can certainly be tested as well, which requires a corresponding adaptation of the wave front of the incoming beam 28 to the respective target shape, e.g. by inserting a suitable beam shaping optical element in the beam path of the incoming beam 28 before it interacts with the test surface 36. Such a beam shaping optical element can be a lens e.g. for forming a spherical wave front. The interaction with the test object can be in form of a reflection of the incoming beam 28 on the surface 36 of the test object 38 or in form of a transmission of the incoming beam 28 through the test object 38. In the latter case, a reflector can be arranged behind the test object 38 to reflect the beam back to the test object 38 to be transmitted by the same again in opposite direction. The resulting measuring beam 34 in this case has interacted twice with the test surface 36.

The incoming beam 28 is directed by a beam splitter 26 onto a Fizeau element 32 having a Fizeau surface 32a. Part of the radiation of the incoming beam 28 is reflected as a reference beam 30 on the Fizeau surface 32a. The radiation of the incoming beam 28 passing through the Fizeau element 36 propagates further in a measuring arm 33 of the interferometer 22 along an optical axis 23 of the interferometer 22 and impinges at the optical test surface 36. The optical axis 23 extends in the z-direction of the coordinate system of FIG. 1.

As indicated above, an optical test surface 36 having a target shape that is not planar, as in the illustrated example, can be investigated according to exemplary embodiments of the invention as well. Examples of the target shape include spherical and aspherical shapes. In case of an aspherical target shape, exceeding the deviations of a nano free form surface, referred to below, from a sphere, the wave front of the incoming beam 28 can be adapted to the target shape e.g. by arranging a correspondingly configured diffractive element, not shown in the drawings, between the Fizeau element 32 and the test object 38. Such a diffractive element can be in the form of a computer generated hologram (CGH).

The incoming beam 28 impinges on the test surface 36 in auto collimation. After having interacted with the test surface 36, the incoming beam 28 is referred to as measuring beam 34 propagating in the measuring arm 33 in the opposite direction as the incoming beam 28, and further in the same optical path as the reference beam 30, passing through the beam splitter 26, a collimator 40, an aperture 42 and an ocular 44 being followed by an interferometer camera 46 in form of a CCD camera. The measuring beam 34 and the reference beam 30 generate an interference pattern, also referred to as interferogram, at a detection surface of the interferometer camera 46. The detection surface extends in the x-y plane according to the coordinate system of FIG. 1. The interferogram is evaluated by the evaluation device 48 to therefrom calculate a wave front deviation between the measuring beam 34 and the reference beam 30. The wave front deviation is a two dimensional distribution of the wave front deviation in a plane perpendicular to the optical axis 23. The deviation of the optical test surface 36 from the target shape can be deduced from the wave front deviation.

Before operating the measuring apparatus 10 the interferometer 22 is calibrated using a rotationally symmetric calibration surface, which is arranged instead of the test object 38 according to FIG. 1. The rotationally symmetric calibration surface is configured such that all single rays of the incoming beam 28 impinge perpendiculary onto the calibration surface. Depending on the target shape to be measured the calibration surface can have a plane, spherical or aspherical shape. In this calibration procedure a corresponding wave front deviation is attributed to errors generated by the interferometer. This "calibration wave front deviation" is stored in the evaluation device 48 and subtracted from the wave front deviation measured subsequently for a respective test object 38.

The target shape of the test surface is deviating from the rotationally symmetric calibration surface, such that a wave front deviation of larger than $10*\lambda$ is obtained when performing the interferometric measurement in optimum alignment, in which the test surface and optical components of the interferometer are aligned such that the wave front deviation is minimized. An example of a target shape fulfilling these requirements is a so-called nano free form surface as explained in detail below. Single rays of the measuring beam 34 travel on a deviated path through the interferometer 22 as compared to the corresponding rays in the calibration measurement. One of the these rays travelling on a deviated path is depicted in FIG. 1 and designated by the reference numeral 28a when being a ray of the incoming beam 28 and reference numeral 34a when being the corresponding ray in the measuring beam 34.

The ray 28a impinges upon the test surface 36 at an angle deviating from the surface normal 37 by a tilt angle $\epsilon$. Put in different words the propagation direction of the ray 28a is deviated by the tilt angle $\epsilon$ at the location of interaction with the test surface 36. In the example depicted in FIG. 1 the radiation of the ray 28a is reflected at the test surface 36, wherein the reflected ray being designated by 34a passes through the interferometer on a deviated path. The deviated path is deviated with respect to the path taken by the ray in case of its impingement on the test surface 36 substantially at a 90° angle. This ray would take a so-called undeviated path. This would be the case if the optical test surface was configured such that the wave front deviation obtained in optimum alignment was smaller than $\lambda$. In this case the ray 28a would essentially be reflected into itself. The fictitious undeviated path of the ray 34a therefore corresponds to the path of the ray 28a in the measuring arm 33 of the interferometer 22 in opposite direction followed by the path of the respective ray 30a of the reference beam 30.

As illustrated in FIG. 1 the ray 34a travelling on the deviated path passes a number of interferometer surfaces $S_1$ to $S_9$, wherein $S_1$ and $S_2$ are the front and back surfaces of the Fizeau element 32, $S_3$, $S_4$, $S_5$ are surfaces of the beam splitter, $S_6$ and $S_7$ are the front and back surfaces of the collimator, $S_8$ and $S_9$ are the front and back surfaces of the ocular 44. At each of the interferometer surfaces $S_1$ to $S_9$ the ray 34a accumulates aberrations. However, as the ray 34a travels on the deviated path, the ray 34a passes the interferometer surfaces $S_1$ to $S_9$ at different locations compared to the locations the ray would have passed if it travelled on the undeviated path (compare path of the reference ray 30a). As the aberrations on the interferometer surfaces $S_1$ to $S_9$ vary over their cross section, the aberrations accumulated by the ray 34a having travelled on the deviated path differ from the aberrations accumulated by the ray 34a if having travelled on the undeviated path.

The error in the measured wave front deviation caused by the accumulated aberrations of the ray 34a therefore differs from the error caused by the accumulated aberrations of the ray in case of having travelled on the undeviated path. The interferometer 22 however is calibrated to the wave front errors generated by the aberrations accumulated by the ray having travelled on the undeviated path. The calibration therefore has only limited validity.

This error deviation is referred to as retrace error $\Delta W_R(x, y)$. The retrace error $\Delta W_R(x, y)$ can be approximated for weakly distorting arrangements as follows:

$$\Delta W_R(x, y) = \sum_{i=1}^{N} (W_i(x + k_i \varepsilon_x, y + k_i \varepsilon_y) - W_i(x, y)), \quad (1)$$

wherein $W_i(x, y)$ is the contribution of the interferometer surface $S_i$ to the wave front deviation, $\varepsilon_x$ and $\varepsilon_y$ are the tilt angles of the test surface 36 in x and y at the respective coordinates x and y, $k_i$ is a shearing factor (defining the lateral shift of the ray 34a per tilt angle $\varepsilon$) for the ray shift on the interferometer surface $S_i$; $k_i \cdot \varepsilon_y$ e.g. represents the shift $\Delta y$ of ray 34a compared to ray 30a in the y-direction, as indicated in FIG. 1 for the example of interferometer surface $S_7$.

The retrace error is particularly large in case the test surface 34 is a so-called nano free form surface. The target shape of a nano free form surface is approximated to a rotationally symmetric shape. However, the target shape deviates from the rotational symmetry to an extent to which it is still possible to measure the actual shape of the surface using an interferometer calibrated to the corresponding rotationally symmetric shape. The deviation of a nano free form surface from the rotational symmetry therefore is limited to a level, which is defined by the measuring dynamics of the interferometer.

In detail the target shape of the test surface 36 in form of a nano free form surface has a deviation z from the rotationally symmetric calibration surface, which deviation z is in the direction of the optical axis 23 of the interferometer 22, wherein the gradient $$\frac{\partial z}{\partial x_i}$$

is smaller than $0.5 \cdot N \cdot \lambda/D$ and larger than $0.002 \cdot N \cdot \lambda/D$. Therein $x_i$ is either x or y, N is the number of pixels available along a dimension on the interferometer camera 46 for recording an interferogram generated by a test surface having a diameter D and $\lambda$ is the wavelength of the electromagnetic radiation 14. Typical values for the parameters N and $\lambda$ are: $500 \leq N \leq 2000$, 10 mm $\leq D \leq 600$ mm. Examples for the wavelength $\lambda$ are 632.8 nm and 532 nm. According to one exemplary embodiment $\partial z/\partial x_i$ is larger than 0.0002, according to further exemplary embodiments larger than 0.0001 and larger than $8 \cdot 10^{-7}$. Accordingly the rays of the incoming beam impinge onto the test surface at angles deviating from 90° in one exemplary embodiment by more than 0.01° in another embodiment by more than 0.007° and in a further exemplary embodiment by more than 0.00005°.

In certain exemplary embodiments according to the invention the target shape has a deviation z from a rotationally symmetric calibration surface in the direction of the optical axis 23 and gradient differences $g_x$ and $g_y$ are defined as follows:

$$g_x = \max\left(\frac{\partial z}{\partial x}\right)_j - \min\left(\frac{\partial z}{\partial x}\right)_j, \text{ and } g_y = \max\left(\frac{\partial z}{\partial y}\right)_j - \min\left(\frac{\partial z}{\partial y}\right)_j \quad (2)$$

with x and y being the dimensions according to the coordinate system shown in FIG. 1, and j signifying the pixels on the target shape, wherein the target shape of the optical test surface fulfills the following conditions:

$$g_x \leq 0.5 \cdot N \cdot \lambda/D \text{ and } g_y < 0.5 \cdot N \cdot \lambda/D \quad (3)$$

and further $$g_x > 0.002 \cdot N \cdot \lambda/D \text{ and/or } g_y > 0.002 \cdot N \cdot \lambda/D, \quad (4)$$

with N being the number of pixels along a dimension of the interferometer camera 46 and the measuring beam having interacted with the test surface having a diameter D perpendicular to the axis of symmetry, and $\lambda$ being the wavelength of the electromagnetic radiation. That means $g_x$ and $g_y$ are each smaller than $0.5 \cdot N \cdot \lambda/D$ and either $g_x$ or $g_y$ is larger than $0.002 \cdot N \cdot \lambda/D$ or both $g_x$ and $g_y$ are larger than $0.002 \cdot N \cdot \lambda/D$. According to an exemplary embodiment $g_x$ and $g_y$ are each smaller than 0.03 and at least one of $g_x$ and $g_y$ is larger than 0.0001.

According to exemplary embodiments of the invention the retrace error $\Delta W_R(x, y)$ in the wave front deviation is determined during the measurement of a test surface 34, which is in particular a nano free form surface. Further, the measured wave front deviation is corrected by eliminating the retrace error therefrom. This allows a more precise measurement and production of the shape of the test surface, as the calibration of the interferometer 22 is adjusted to the actual ray path distribution of the measuring beam 34 in the interferometer 22. The correction of the retrace error in accordance with exemplary embodiments of the invention allows the production of objects having a non-rotational target shape, like the nano free form surfaces detailed above, using an interferometer calibrated to a rotationally symmetric calibration surface. This way a non-rotationally-symmetric test surface 34 can be measured using a turn averaging technique, in which the test surface 34 is arranged in several rotational positions with respect to the optical axis 23 of the interferometer and measurements are made for each of the rotational positions. The turn averaging technique allows a further improvement in the measurement accuracy.

Figure 2:
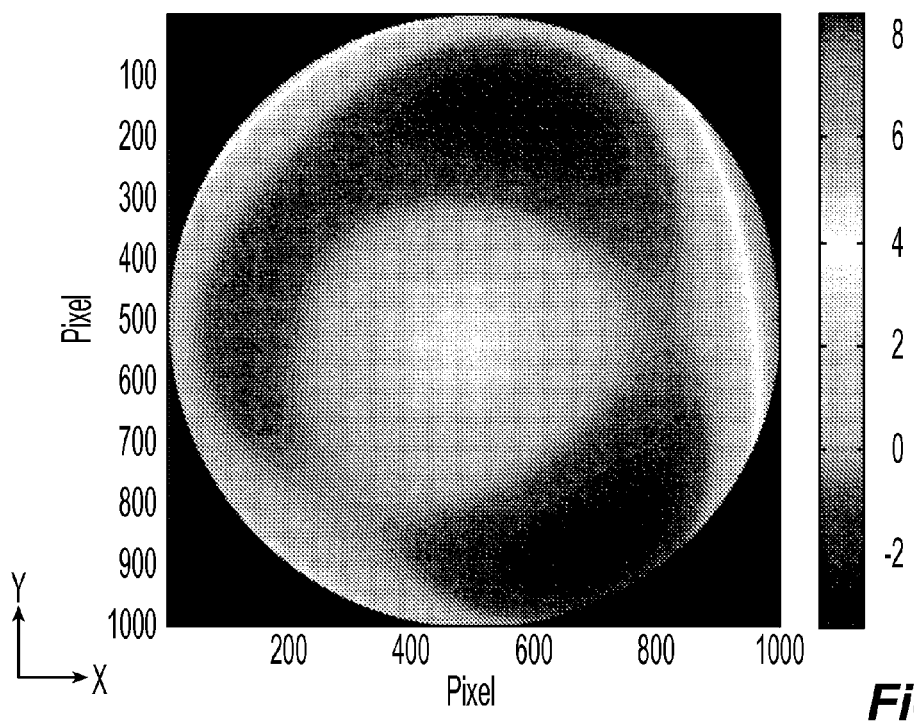
FIG. 2 depicts an example of a wave front deviation distribution measured by the apparatus according to FIG. 1, which wave front deviation distribution contains long range retrace errors.

According to exemplary embodiments of the invention the determination of the retrace errors is performed differently depending on whether the retrace errors are long range or short range retrace errors. Long range retrace errors are present in case the distance between the location, at which the measurement ray 34a travelling on the deviated path through the interferometer 22 impinges on one of the interferometer surfaces $S_1$ to $S_9$ and the location, at which the corresponding reference ray 30a impinges on the respective interferometer surface, is for each of the interferometer surfaces $S_1$ to $S_9$ smaller than a minimum spatial cycle of the retrace error in the wave front deviation distribution recorded by the interferometer camera 46. The minimum spatial cycle of the retrace error is determined by performing a Fourier transformation on the two dimensional wave front deviation distribution resulting in a frequency distribution. The wavelength corresponding to the largest frequency in the frequency distribution is the minimum spatial cycle of the retrace error. FIG. 2 shows an example of a wave front deviation distribution containing a long range retrace error. Long range retrace errors are in particular retrace errors of spatial cycles in the range between 1 mm and the diameter D of the test surface. Such long range retrace errors can e.g. be caused by a misalignment of the optical components 26, 32, 40 and 44 within the interferometer 22 or a misalignment of the test surface 36 with respect to the interferometer 22.

Figure 4:
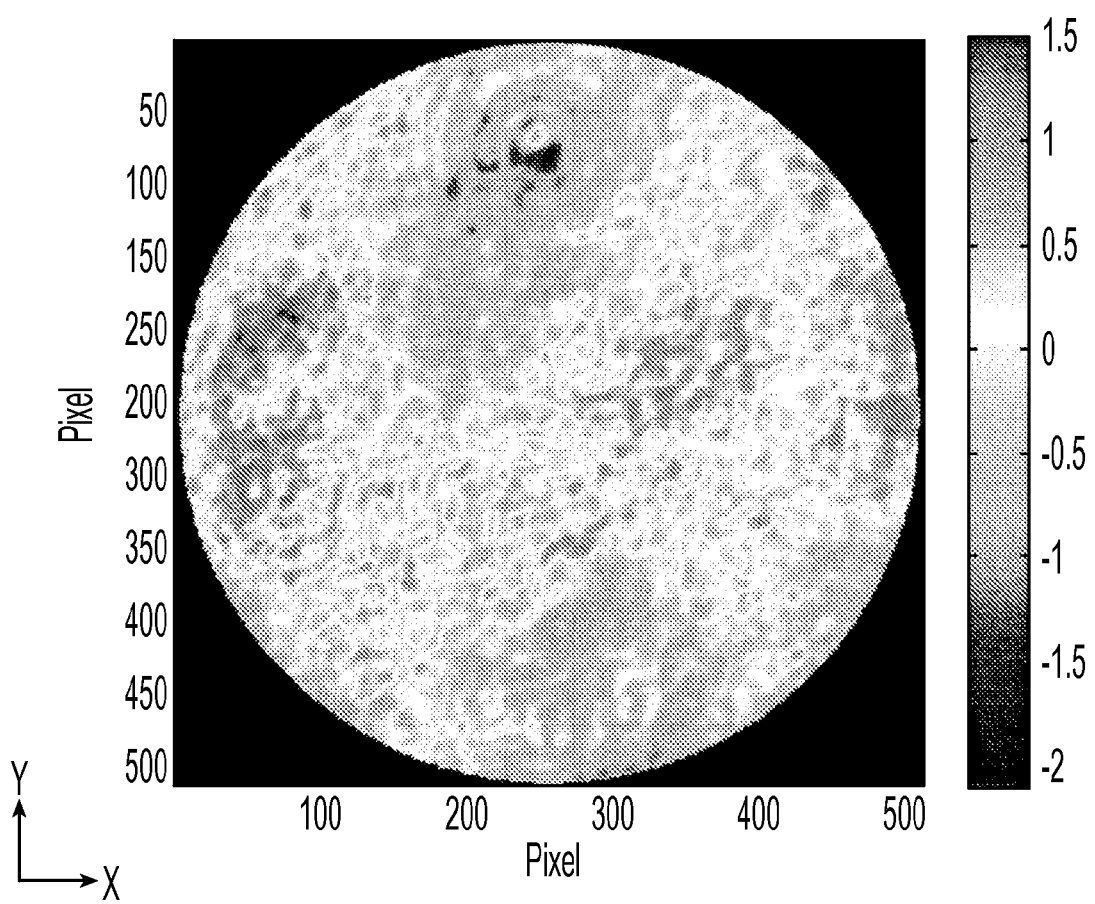
FIG. 4 depicts an example of a wave front deviation distribution measured by the apparatus according to FIG. 1, which wave front deviation distribution contains short range retrace errors.

A short range retrace error is present if the distance between the location, at which the measurement ray 34a travelling on the deviated path through the interferometer 22 impinges on one of the interferometer surfaces $S_1$ to $S_9$ and the location, at which the corresponding reference ray 30a impinges on the respective interferometer surface, is for each of the interferometer surfaces $S_1$ to $S_9$ larger than the minimum spatial cycle of the retrace error in the wave front deviation recorded by the interferometer camera 46. An example of a wave front deviation distribution containing a short range retrace error is shown in FIG. 4.

The main cause of short range retrace errors are fine surface structures, like scratches, surface defects and dust particles, on the optical surfaces $S_1$ to $S_9$ of the interferometer 22. Short range retrace errors are in particular retrace errors of spatial cycles below 1 mm, especially below 500 μm or below 100 μm, and above 1 μm, especially above 5 μm or above 10 μm.

Long range retrace errors can be determined by a long range retrace parameter being a differential quotient as explained below. They show linear behavior and do not necessarily have to be related back to single optical interferometer surfaces $S_1$ to $S_9$. For determining the long range retrace errors first the above mentioned long range retrace parameter G is determined. This is done by arranging a calibration surface, which can be either the test surface 34 or preferably a rotationally symmetrical surface, at the location of the test surface 34 in FIG. 1 subsequently in an untilted position and two tilt positions. In case a rotationally symmetrical surface is used, the calibration surface does not generate retrace errors at all in the untilted position. The tilt positions include a first tilt position, also referred to as x-tilted position, and a second tilt position, also referred to as y-tilted position. In the x-tilted position the calibration surface is tilted by the tilt angle $\Delta\epsilon_x$ in x-direction with respect to the untilted position, i.e. the calibration surface is rotated around the y-axis by the tilt angle $\Delta\epsilon_x$. In the y-tilted position the calibration surface is tilted by the tilt angle $\Delta\epsilon_y$ in y-direction with respect to the untilted position. i.e. the calibration surface is rotated around the x-axis by the tilt angle $\Delta\epsilon_y$.

The resulting wave front deviation is measured by the interferometer 22 for each of the three positions. Subsequently, the difference $\Delta W_x(x,y)$ between the respective wave front deviations for the untilted position and the x-tilted position and the difference $\Delta W_y(x,y)$ between the respective wave front deviations for the untilted position and the y-tilted position are calculated. Therefrom the x and y components $G_x$ and $G_y$ of the long range retrace parameter G, also referred to as retrace differential quotients, are calculated as follows:

$$G_x(x, y) = \frac{\Delta W_x(x, y)}{\Delta \varepsilon_x}; \quad (5)$$

$$G_y(x, y) = \frac{\Delta W_y(x, y)}{\Delta \varepsilon_y}. \quad (6)$$

The components $G_x$ and $G_y$ of the long range retrace parameter G are saved in the evaluation device 48 as calibration data sets.

Figure 3:
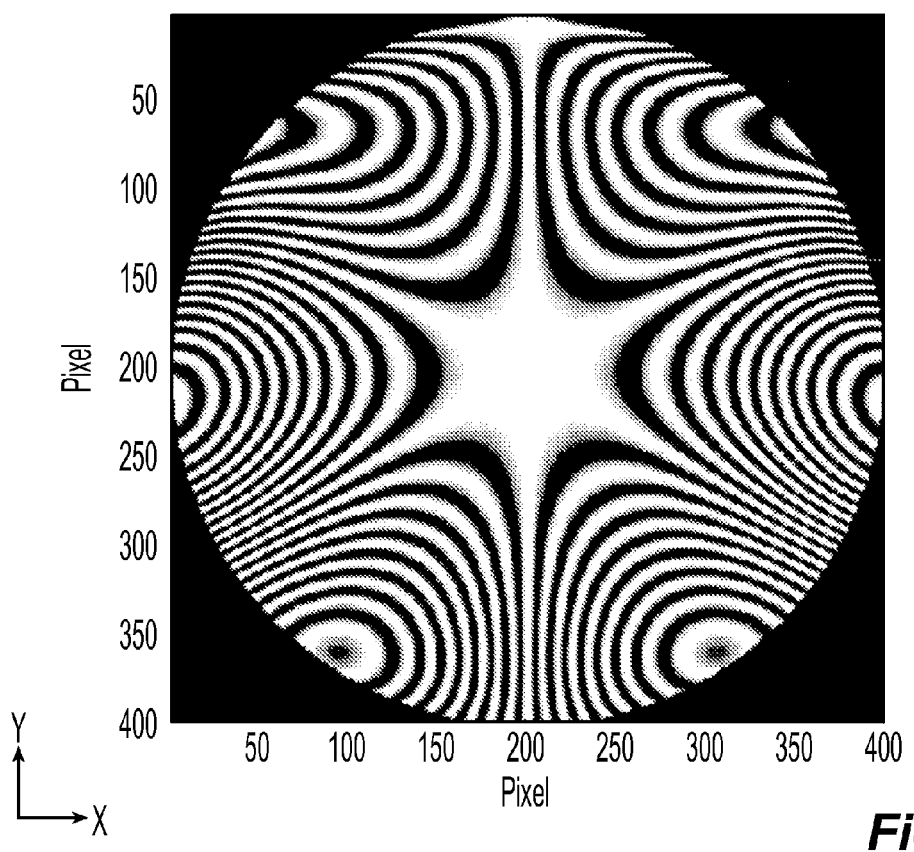
FIG. 3 depicts an example of an interferogram recorded by an interferometer camera of the apparatus according to FIG. 1 during testing of a nano free form surface.

When measuring the shape of a given test surface 36 using the measuring apparatus 10 according to FIG. 1, first the resulting interferogram recorded by the interferometer camera 46 is analyzed. An example of such an interferogram recorded for a nano free form surface is depicted in FIG. 3. Thereby the local tilts $\epsilon_x(x,y)$ and $\epsilon_y(x,y)$ of the test surface 36 are determined from the local fringe densities in the interferogram. This is performed by determining $$\frac{\partial W(x, y)}{\partial x}$$

and $$\frac{\partial W(x, y)}{\partial y}$$

from the corresponding wavefront deviation distribution and calculating $\epsilon_x(x,y)$ and $\epsilon_y(x,y)$ as follows:

$$\varepsilon_x(x, y) = \arctan\left(m\frac{\partial W(x, y)}{\partial x}\right), \quad (7)$$

$$\varepsilon_x(x, y) = \arctan\left(m\frac{\partial W(x, y)}{\partial y}\right), \quad (8)$$

wherein m is a scale factor of the interferometer 22, determined beforehand.

The local retrace error $\Delta W_R(x,y)$ is subsequently calculated as follows:

$$\Delta W_R(x,y) = G_x(x,y)\epsilon_x(x,y) + G_y(x,y)\epsilon_y(x,y) \quad (9)$$

The retrace error $\Delta W_R(x,y)$ is then subtracted from the wave front deviation distribution measured for the given test surface 36. This results in a corrected wave front deviation distribution with the retrace error being eliminated therefrom.

In case short range retrace errors are present in the measured wave front deviation the following correction algorithm is performed. As already detailed above, in this case $k_i \cdot \epsilon$ is larger than the error wave length for each optical interferometer surface $S_1$ to $S_9$. The overall retrace error displays non linear behavior, however the contributions of the single interferometer surfaces are linear. An example of a wave front deviation distribution displaying a short range retrace error is shown in FIG. 4.

For determining the short range retrace error contributions of N interferometer surfaces M wave front measurements are performed, wherein M>N. For each of the M wave front measurements the optical test surface 36 is arranged at a different tilt in x- or y-direction. For measurement j=1 ... M equation (1) becomes equation (10):

$$\Delta W_{R,j}(x, y) = \sum_{i=1}^{N} (W_i(x + k_i\varepsilon_{x,j}, y + k_i\varepsilon_{y,j}) - W_i(x, y)). \quad (10)$$

If the shearing factors $k_i$ are known for each surface, e.g. by precalculation using a beam calculation program or by analysis of $\Delta W_R^{(j)}$ the retrace error contributions $W_i(x,y)$ of the single interferometer surfaces $S_i$ can be determined for a set of M measurements with different tilts. Two exemplary embodiments for determining the contributions $W_i(x,y)$ are described in the following.

According to a first exemplary embodiment the contributions are determined iteratively. The first exemplary embodiment is based on the recognition that only the contributions $W_i(x,y)$ add up constructively, while the contributions $W_r(x,y)$ for $r \neq i$ delete each other mostly, if the $\Delta W_R^{(j)}$ wave front errors are shifted by exactly the shearing amount $\lfloor (k_i \epsilon_{x,j}, k_i \epsilon_{y,j}) \rfloor$ and subsequently the average of all M error wave fronts is calculated. By this an approximation for $W_i(x,y)$ is obtained. From this the following iterative behavior can be deduced:

start: for i=1 ... N: $W_i^{(0)}(x, y) \equiv 0$
iteration rule (n)→(n+1):

$$\Delta W_{R,j}^{(n)}(x, y) = \Delta W_{R,j}(x, y) - \left( \sum_{i=1}^{N} W_i^{(n)}(x + k_i \varepsilon_{x,j}, y + k_i \varepsilon_{y,j}) - W_i^{(n)}(x, y) \right) \quad (11)$$

$$W_i^{(n+1)}(x, y) = \frac{1}{M} \sum_{j=1}^{M} [\Delta W_{R,j}^{(n)}(x - k_i \varepsilon_{x,j}, y - k_i \varepsilon_{y,j})] \quad (12)$$

The iteration is stopped when $$\sum_{j=1}^{M} \int\!\!\int_{x,y} (\Delta W_{R,j}^{(n)}(x, y))^2$$

does not become any smaller.

According to a second exemplary embodiment for determining the contributions $W_i(x,y)$ a corresponding equation system is solved. Here the minimization of the integral $$S = \int\!\!\int_{x,y} \left[ \Delta W_{R,j}(x, y) - \left( \sum_{i=1}^{N} W_i(x + k_i \varepsilon_{x,j}, y + k_i \varepsilon_{y,j}) - W_i(x, y) \right) \right]^2 \quad (13)$$

under variation of all $W_i(x,y)$ leads to a linear equation system, the solution of which are the contributions $W_i(x,y)$.

According to exemplary embodiments of the invention the measuring apparatus 10 is used for producing an optical element configured as a free form surface, the target function of which cannot be described by a rotationally symmetrical function. An example of such an optical element is the first minor M1 of the projection objective 107 depicted in FIG. 6 and described in detail in the following. For the purpose of producing such an optical element the optical element is manufactured such that its surface roughly fits the target shape. Thereafter the deviation of the optical surface from the target shape is determined by measuring apparatus 10 performing the inventive method described above. Thereafter the optical surface is mechanically processed in order to eliminate the determined deviation. Subsequently the achieved surface can be measured again to evaluate the quality of the mechanical processing. Mechanical processing and measurement can be repeated as long as it is required to obtain the optical surface with the desired accuracy with respect to its target shape.

Figure 5:
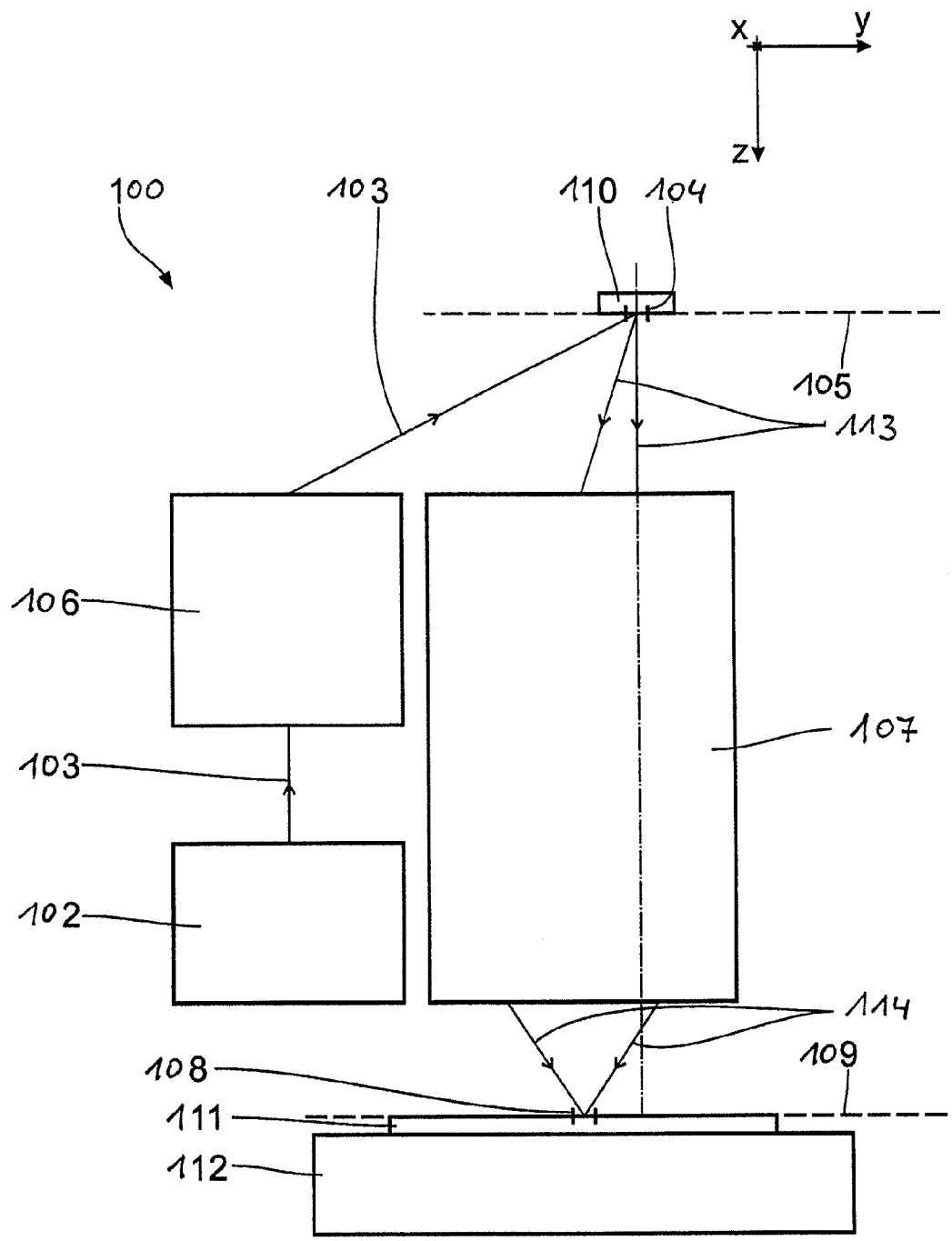
FIG. 5 depicts schematically a projection exposure tool for EUV-microlithography comprising an optical element manufactured using the measuring apparatus according to FIG. 1.

FIG. 5 shows a projection exposure tool 100 for microlithography including at least one optical element produced by the measurement method according to exemplary embodiments of the invention described above. The projection exposure tool 100 comprises a radiation source 102 for generating illumination radiation 103. The radiation source 102 is an EUV-radiation source, which generates radiation in the wavelength range below 100 nm, in particular between 5 nm and 20 nm and especially between 5 nm and 10 nm. The radiation source 102 can in particular be a radiation source generating the wavelength of 13.5 nm or the wavelength of 6.9 nm. Also different EUV-wavelengths are possible. In general, even arbitrary wavelengths, for example visible wavelengths or other wavelengths which are utilized in microlithography and for which suitable laser light sources and/or LED-light sources are available (for example 365 nm, 248 nm, 193 nm, 157 nm, 129 nm, 109 nm) are possible for the illumination radiation guided within the protection exposure tool 100. A beam path of the illumination radiation 103 is illustrated very schematically in FIG. 5.

For guiding the illumination radiation 103 from the radiation source 102 to an object field 104 (compare FIG. 10) in an object plane 105 illumination optics 106 are provided. The object field 104 is imaged into an image field 108 (compare FIG. 6 in an image plane 109 with a predetermined demagnification scale by a projection objective 107, also referred to as imaging optics. The projection objective 107 is in one exemplary embodiment configured according to FIG. 6. The projection objective 107 according to FIG. 6 demagnifies the object field 104 by a factor of four.

Also different demagnification scales are possible, for example 5×, 6× or 8× as well as demagnification scales, which are larger than 8× or which are smaller than 4×, for example 2× or 1×. The image plane 109 is in the exemplary embodiment according to FIG. 6 arranged parallel to the object plane 105. Here an area of a reflection mask 110, also referred to as reticle, coinciding with the object field 104 is imaged.

Figure 6:
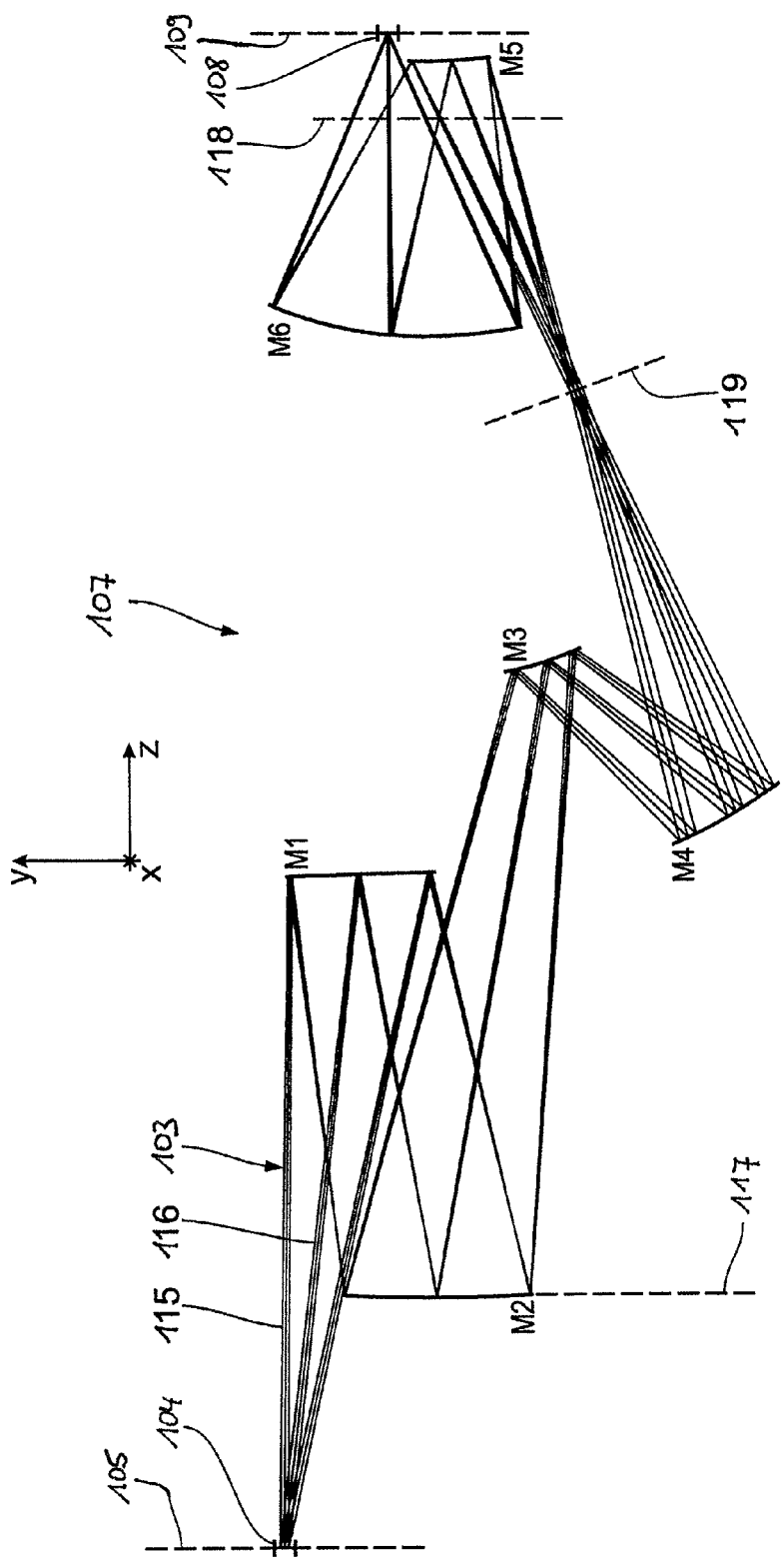
FIG. 6 shows an exemplary embodiment of imaging optics of the projection exposure tool according to FIG. 5 depicted in meridian section.

The imaging by the projection objective 107 is performed onto the surface of a substrate 111 in form of a wafer, which is held by a substrate holder 112. FIG. 5 shows schematically a ray bundle 113 of the illumination radiation 103 between the reflection mask 110 and the projection objective 107, which ray bundle 113 is entering into the projection objective 107. Further FIG. 5 shows a ray bundle 114 of the illumination radiation 103 between the projection objective 107 and the substrate 111, which ray bundle 114 is exiting the projection objective 107. The illumination radiation 103 imaged by the projection objective 107 is also referred to as imaging radiation. An image field size numerical aperture of the projection objective 107 in the exemplary embodiment according to FIG. 6 is 0.36. This is not represented in scale in FIG. 5.

In order to facilitate the description of the projection exposure tool 100 as well as an exemplary embodiment of the projection objective 107 a Cartesian xyz coordinate system is depicted in the drawings, from which the respective positional relationship of the components illustrated in the figures can be established. In FIG. 5 the x-direction extends perpendicular to the plane of the drawing into the same. The y-direction extends towards the right side and the z-direction downwards.

The projection exposure tool 100 is of the scanner type. Both the reflection mask 110 and the substrate 111 are scanned during operation of the projection exposure tool 100 in y-direction. Also a stepper type of the projection exposure tool 100 is possible, in which a stepwise displacement of the reflection mask 110 and the substrate 111 in y-direction is performed between the single exposures of the substrate 111.

FIG. 6 shows the optical design of an exemplary embodiment of the projection objective 107. Therein the beam path of each of three single rays 115 is shown for three object field points, which are spaced from each other in y-direction according to FIG. 6. The three single rays 115 associated with one of these three object field points, are associated to three different illumination directions for the three object field points. Main beams 116 pass through the center in pupils in pupil planes 117, 118 of the protection objective 107. Starting from the object plane 105 those main beams 116 propagate initially convergent. This is referred to subsequently also as positive back focal length of an entrance pupil of the projection objective 107. The entrance pupil in the pupil plane 117 of the projection objective 107 according to FIG. 6 is located within the projection objective 107.

The projection objective 107 according to FIG. 6 comprises in total six mirrors, which are, starting from the object field 104, numbered with M1 to M6 in the sequence of the imaging beam path of the single rays 115. In FIG. 6 only the calculated reflection surfaces of the mirrors M1 to M6 are shown. The mirrors M1 to M6 are typically larger than the actually used reflection surfaces.

The mirrors M1, M2, M4 and M6 are configured as concave mirrors. The mirrors M3 and M5 are configured as convex mirrors.

The mirrors M1 and M4 on the other hand and the mirrors M3 and M6 on the other hand are arranged back to back with respect to the orientation of their reflection surfaces.

The entrance pupil plane 117 is located in the area of mirror M2 for the projection objective 107 according to FIG. 5. Between the mirrors M4 and M5 an intermediate image plane 119 is located. The exit pupil plane 118 is arranged in the imaging beam path between the mirrors M5 and M6.

The optical data of the projection objective 107 according to FIG. 6 are represented in the following table, which is divided into several sub-tables.

The exact shape of the single reflection surfaces of the mirrors M1 to M6 results from the sum of a rotationally symmetric reference asphere, which is also referred to as basic asphere, and a free form term in the form of a XY-polynomial. The value Y is shifted, depending on the position of the respective mirror M1 to M6, by a decentration value Dy0, which is listed at the end of the second sub-table.

The rotationally symmetric reference asphere can be chosen such that it comprises a minimum deviation from the free form surface. In this case, the reference asphere is at the same time the best fitting asphere of the free form surface. The rotationally symmetric reference asphere can also be chosen differently and therefore does not have to be identical with the best fitting asphere. The basic asphere is calculated by the following asphere equation:

$$z = \frac{h^2/RDY}{1+\sqrt{1-(1+CCY)h^2/RDY^2}} + \sum_{k=1}^{n} c_k h^k, \quad (14)$$

$$h = \sqrt{x^2 + y^2}$$

wherein x and y are the coordinates on the basic asphere starting from a coordinate origin, which can also be located outside the utilized area of the surface of the basic asphere. Z is an arrow height of the basic asphere, RDY is the radius of the basic asphere, therefore the inverse of the surface curvature in the coordinate origin, and CCY is a conical parameter.

The value "spacing" in the following first sub-table signifies the spacing to the respective subsequent component. In the second sub-table the value "coefficient" signifies the index k for the coefficient $c_k$ of the basic asphere equation (14).

The following free form surface term is added:

$$z_F = \sum_{i=0}^{n} \sum_{j=0}^{n} a_{i,j} x^i \tilde{y}^j \quad (15)$$

$$\tilde{y} = y - Dy0,$$

wherein $z_F$ represents the arrow height of the free form term relative to the reference asphere. The y-coordinate of the free form term is shifted by the decentration value Dy0 with respect of the y-coordinate of the reference asphere.

| | | | | Projection objective 107 | | | | |
|---|---|---|---|---|---|---|---|---|
| | | Object | M1 | M2 | M3 | M4 | M5 | M6 |
| spacing [mm] | | 726,546191 | −456,894259 | 662,640221 | −229,678071 | 892,995179 | −295,316873 | 325,045697 |
| RDY [mm] | | | −2657,095896 | −1309,948227 | 308,461174 | −518,830174 | 396,693971 | −369,501481 |
| CCY | | | −9,419257 | −4,39783 | −0,84874 | −0,143937 | −0,121327 | 0,101899 |
| Basic asphere | Coefficient | | M1 | M2 | M3 | M4 | M5 | M6 |
| | 4 | | 5,178979E−10 | −9,445613E−11 | 3,473074E−11 | 1,347509E−11 | 1,193632E−08 | 8,695903E−12 |
| | 6 | | −4,244132E−15 | 5,132988E−16 | 8,581153E−15 | −5,814514E−16 | 7,415353E−13 | 9,285618E−16 |
| | 8 | | −5,447933E−20 | 2,351217E−20 | 9,490453E−20 | 1,880124E−21 | 2,536115E−17 | −8,136730E−21 |
| | 10 | | 3,012623E−24 | −1,046920E−24 | −2,448303E−23 | −7,376969E−27 | −4,169761E−21 | −9,744271E−26 |
| | 12 | | −4,822565E−29 | 9,282073E−29 | 8,824884E−28 | 4,441271E−33 | 3,978086E−25 | −3,550219E−31 |

-continued

| Projection objective 107 | | | | | | |
|---|---|---|---|---|---|---|
| 14 | 4,538299E−34 | −3,285815E−33 | −9,408217E−33 | −2,646137E−38 | −2,219546E−29 | −4,812005E−36 |
| Dy0 [mm] | 100,232448 | 101,124629 | −134,314784 | −243,466088 | 12,469543 | −44,338695 |

| Polynomial coefficients | | | | | | | |
|---|---|---|---|---|---|---|---|
| $x^{}i$ | $y^{}j$ | M1 | M2 | M3 | M4 | M5 | M6 |
| 2 | 0 | −4,975692E−09 | 9,695091E−08 | −2,068596E−08 | 3,206746E−08 | −2,276394E−09 | −1,165903E−07 |
| 0 | 2 | 2,217941E−07 | −2,139894E−07 | −1,985746E−06 | −4,154570E−07 | −2,120053E−06 | 9,109341E−08 |
| 2 | 1 | 2,157083E−09 | −5,373358E−10 | 8,663064E−09 | 2,154247E−09 | −4,318311E−08 | −3,116219E−09 |
| 0 | 3 | 7,267837E−10 | −5,557376E−09 | 1,269693E−07 | −6,469982E−09 | −9,288793E−08 | −2,838594E−09 |
| 4 | 0 | 1,006508E−11 | −9,179722E−13 | −2,044162E−11 | −1,830354E−12 | −2,594418E−10 | 1,838258E−11 |
| 2 | 2 | −2,992633E−11 | −1,208218E−11 | −1,035844E−06 | 5,107694E−11 | −1,023004E−09 | 1,355483E−11 |
| 0 | 4 | −3,802254E−11 | −4,600202E−11 | −3,316814E−09 | −1,169717E−11 | −1,086314E−09 | −3,924079E−12 |
| 4 | 1 | −2,427238E−13 | −9,866594E−14 | 3,738932E−12 | −1,137776E−13 | 1,393821E−11 | 2,723046E−13 |
| 2 | 3 | −5,884727E−13 | 1,904195E−13 | 3,272532E−11 | 2,570044E−13 | −7,876769E−12 | 5,060127E−13 |
| 0 | 5 | −7,669692E−13 | −1,776355E−15 | 4,078071E−11 | −4,386599E−14 | 5,435682E−12 | 2,507825E−13 |
| 6 | 0 | −4,725637E−16 | −5,822574E−16 | −4,223264E−15 | 7,671818E−17 | 8,259254E−14 | −9,846481E−16 |
| 4 | 2 | −9,377688E−16 | −8,947838E−16 | −1,670063E−13 | −1,262538E−15 | 4,767567E−13 | −2,507283E−15 |
| 2 | 4 | −1,093999E−14 | 5,980286E−15 | −4,753590E−13 | −1,081585E−15 | −1,341930E−13 | −2,059553E−15 |
| 0 | 6 | −1,130552E−14 | 2,933843E−15 | −1,251603E−13 | −4,700974E−15 | 1,856171E−13 | −6,728585E−16 |
| 6 | 1 | 2,089697E−19 | −8,672543E−18 | 4,093189E−16 | 2,108881E−18 | −3,109520E−16 | −3,705879E−18 |
| 4 | 3 | −9,698939E−17 | 1,104895E−17 | 2,996991E−15 | 1,197042E−18 | 5,095266E−15 | −1,083421E−17 |
| 2 | 5 | −1,441666E−16 | 5,353036E−17 | 2,237381E−15 | 8,903388E−18 | −5,149099E−16 | −1,100985E−17 |
| 0 | 7 | −9,511112E−17 | 2,316729E−17 | −2,163136E−15 | −2,029320E−17 | 4,893582E−16 | −3,109613E−18 |
| 8 | 0 | 4,163935E−21 | −4,301217E−21 | −4,053853E−19 | −9,852267E−22 | −6,324693E−18 | 1,045914E−20 |
| 6 | 2 | −5,479642E−19 | −1,087286E−20 | −9,376184E−18 | 5,922201E−21 | −5,292930E−17 | 4,748588E−20 |
| 4 | 4 | −1,224810E−18 | 1,503390E−19 | −1,881787E−17 | 1,497284E−20 | 2,260813E−17 | 7,452319E−20 |
| 2 | 6 | −7,792058E−19 | 2,126832E−19 | 1,017139E−17 | 1,232874E−19 | 2,186881E−17 | 5,522350E−20 |
| 0 | 8 | −3,893532E−19 | 7,971168E−20 | 1,912450E−17 | 1,260944E−19 | −1,638439E−17 | 1,367445E−20 |
| 8 | 1 | −1,191724E−21 | 1,554855E−22 | 1,261381E−20 | −1,053922E−23 | 2,437118E−19 | −2,420841E−23 |
| 6 | 3 | −3,467498E−21 | 2,961693E−22 | 4,413801E−20 | −3,702805E−23 | 1,053665E−20 | −1,053577E−22 |
| 4 | 5 | −4,170109E−21 | 5,479512E−22 | 3,143391E−20 | −9,285155E−23 | 6,495759E−19 | −1,513860E−22 |
| 2 | 7 | −2,315023E−21 | 3,526402E−22 | −9,832357E−20 | 2,607107E−22 | 4,039514E−19 | −1,127630E−22 |
| 0 | 9 | −1,081246E−21 | 1,130604E−22 | −2,675396E−20 | 7,342690E−22 | −3,223068E−20 | −2,859206E−23 |
| 10 | 0 | −1,494728E−24 | 0,000000E+00 | 0,000000E+00 | 0,000000E+00 | 2,673763E−21 | 5,921034E−26 |
| 8 | 2 | −2,399468E−24 | 0,000000E+00 | 0,000000E+00 | 0,000000E+00 | 1,109963E−20 | 3,181614E−25 |
| 6 | 4 | 2,272489E−25 | 0,000000E+00 | 0,000000E+00 | 0,000000E+00 | 1,578440E−20 | 6,417671E−25 |
| 4 | 6 | −4,456038E−24 | 0,000000E+00 | 0,000000E+00 | 0,000000E+00 | 1,342665E−20 | 6,335341E−25 |
| 2 | 8 | −4,794566E−24 | 0,000000E+00 | 0,000000E+00 | 0,000000E+00 | 4,953590E−21 | 3,298387E−25 |
| 0 | 10 | −2,459538E−24 | 0,000000E+00 | 0,000000E+00 | 0,000000E+00 | 1,330302E−21 | 7,192177E−26 |

The exemplary embodiment of the projection objective 107 shown in FIG. 6 is represented with an unfolded imaging beam path. It is to be understood that, depending on the space requirements for arranging the respective projection objective 107 in a projection exposure tool additional folding mirrors can be disposed in the beam path between the mirrors M1 to M6.

As it becomes apparent from the above table, all six mirrors M1 to M6 of the projection objective 107 are configured as free form surfaces not describable by a rotationally symmetric function. At least one of the mirrors M1 to M6, especially all of them, is/are produced using the above described measuring method, in which the retrace error is corrected. Also other exemplary embodiments of the projection objective 107 are possible, in which at least one of the mirrors M1 to M6 comprises such a free from reflection surface. At least one reflection surface is thereby configured as a static free form surface not describable by a rotationally symmetric function. Static in this context refers to the fact that the free form surface cannot be modified in its shape in a target manner during operation or in operational breaks of the projection exposure tool 100.

Figure 7:
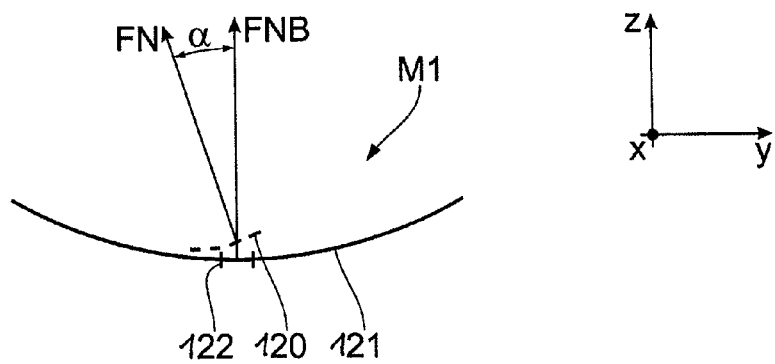
FIG. 7 depicts a section through a surface element of a rotationally symmetric free form surface and through a rotationally symmetric best fitting surface in form of an aspherical surface, wherein an asphere surface element corresponding to the free form surface element is identified.

FIG. 7 shows in a highly schematic and regarding the shown deviation strongly exaggerated representation a free form surface element 120 of an utilized area of the free form surface, for example of the mirror M1, which is configured for guiding the imaging radiation 103. Additionally, FIG. 7 shows an aspherical surface 121, which is the best fitting aspherical surface of the free form surface. The best fitting aspherical surface 121 can be represented by a rotationally symmetric function, for example by the previously already illustrated asphere equation.

Figure 8:
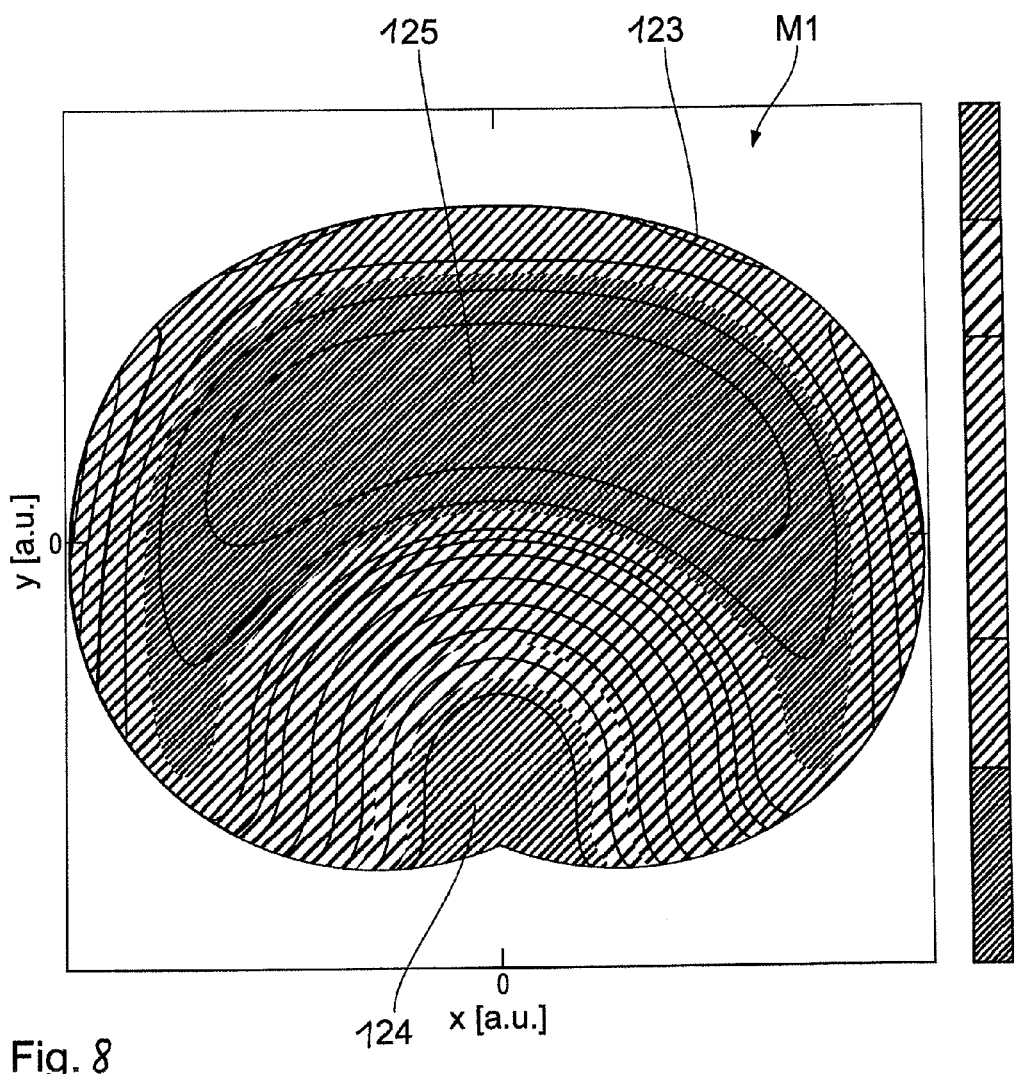
FIG. 8 shows a strongly magnified top-down view onto a utilized area of a reflection surface configured as a free form surface of the first mirror in the imaging beam path of the imaging optics according to FIG. 6, wherein the maximum deviation of the free form reflection surface from the best fitting aspherical surface, which is describable by a rotationally symmetric function, is illustrated by contour lines and hatchures assigned to the size of the deviation.

FIG. 7 further shows a normal FNB on the best fitting aspherical surface 121 in the area of the asphere surface element 122 around the coordinates $x_0$, $y_0$ of the viewed free form surface element 120, and therefore the normal FNB on the asphere surface element 122 corresponding to the free form surface element 120. Starting from the same coordinate $x_0$, $y_0$ with respect to the arrow height z, however, starting from the free form surface element 120, FIG. 8 shows also a normal FN on the free form surface element 120. The two normals FNB and FN enclose an angle α of maximum 70 μrad.

This maximum deviation applies to each pair of free form surface elements and asphere surface elements, corresponding thereto over the total utilized areas of the free form surfaces of the mirrors M1 to M6. Those utilized areas are also referred to as usable surfaces. The optically utilized areas of all mirrors M1 to M6 have no opening for passing the imaging radiation 103, and are therefore not obscured.

FIG. 8 shows an arrow height-deviation Δz of the utilized area 123 of the free form surface of the mirror M1, which comprises approximately the basic shape of a bean or kidney. Therefore, the deviation of the z-value of the basic asphere from the z-value of the actually utilized free form surface at the respectively viewed y,x-point is depicted.

In the area of a constriction 124 of the utilized area 123, therefore at smallest y-values and at medium x-values of the utilized area 123, the arrow height-deviation of the free form surface from the best fitting aspherical surface is maximal with a value of about 0.5 µm. Everywhere else the error height deviation of the utilized area 123 is smaller and is close to zero in a large area 125, which extends in an arc shape around the constriction 124.

The free form surface deviates from the best fitting aspherical surface at the maximum by more than the wavelength of the illumination or imaging radiation 103 as long as wavelengths of less than 500 nm are used for the imaging radiation 103.

Figure 9:
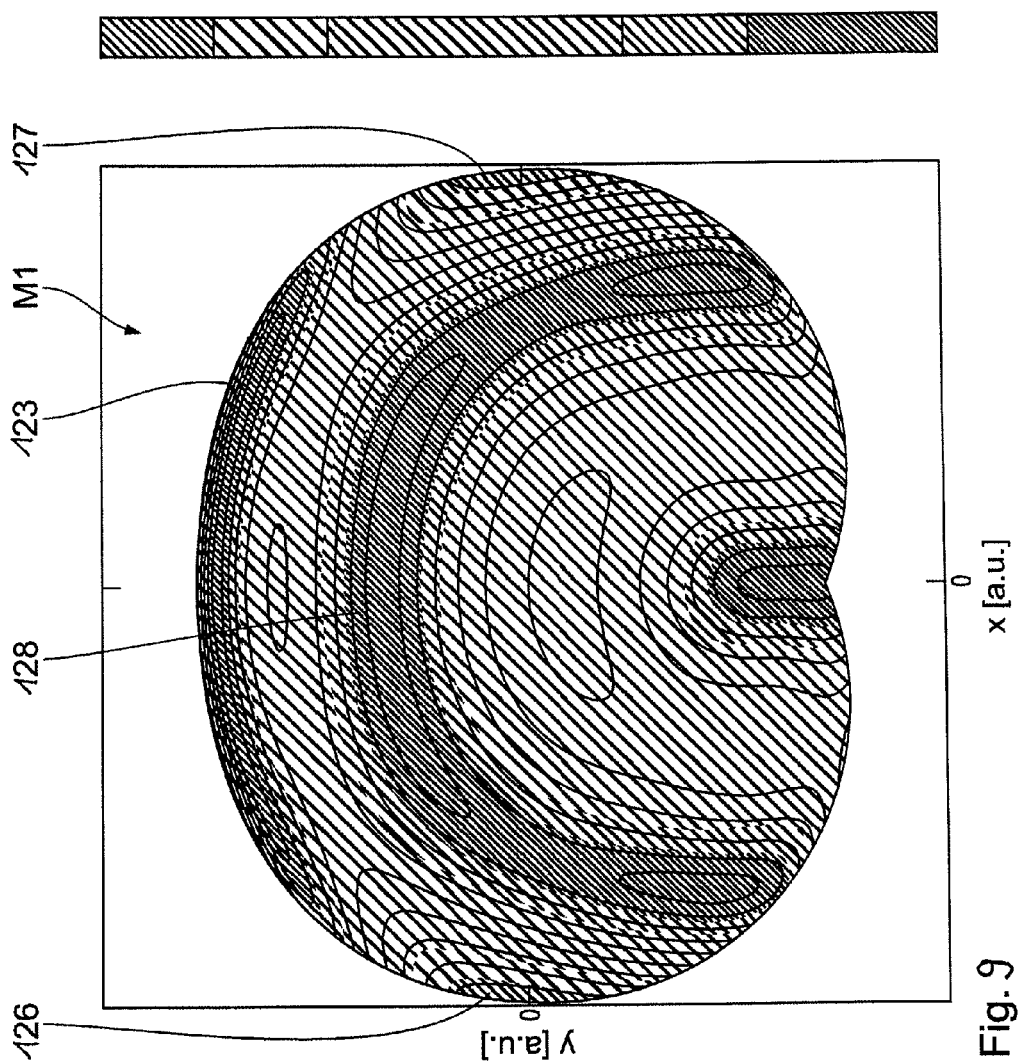
FIG. 9 shows in a representation similar to FIG. 8 a maximum gradient of the deviation of the free form reflection surface of the first mirror from the best fitting aspherical surface.

FIG. 9 shows the maximum angular deviation of the two normals FN, FNB from each other also for the utilized area 123 of the mirror M1. This angular deviation is maximum at maximum and at minimum x-values in two oppositely arranged border areas 126, 127 of the utilized area 123 with a value of about 15 µrad. Everywhere else the angle between the normal FN, FNB, that means a maximum gradient of the deviation of the free form surface from the best fitting aspherical surface, is smaller. In the area of the constriction 124 as well as in an arc shaped area 128 around the constriction 124, which extends in comparison to the arc shaped area 125 of FIG. 8 somewhat smaller around the constriction 124, the maximum gradient of the deviation of the free form surface from the best fitting aspherical surface is again close to zero.

Figure 10:
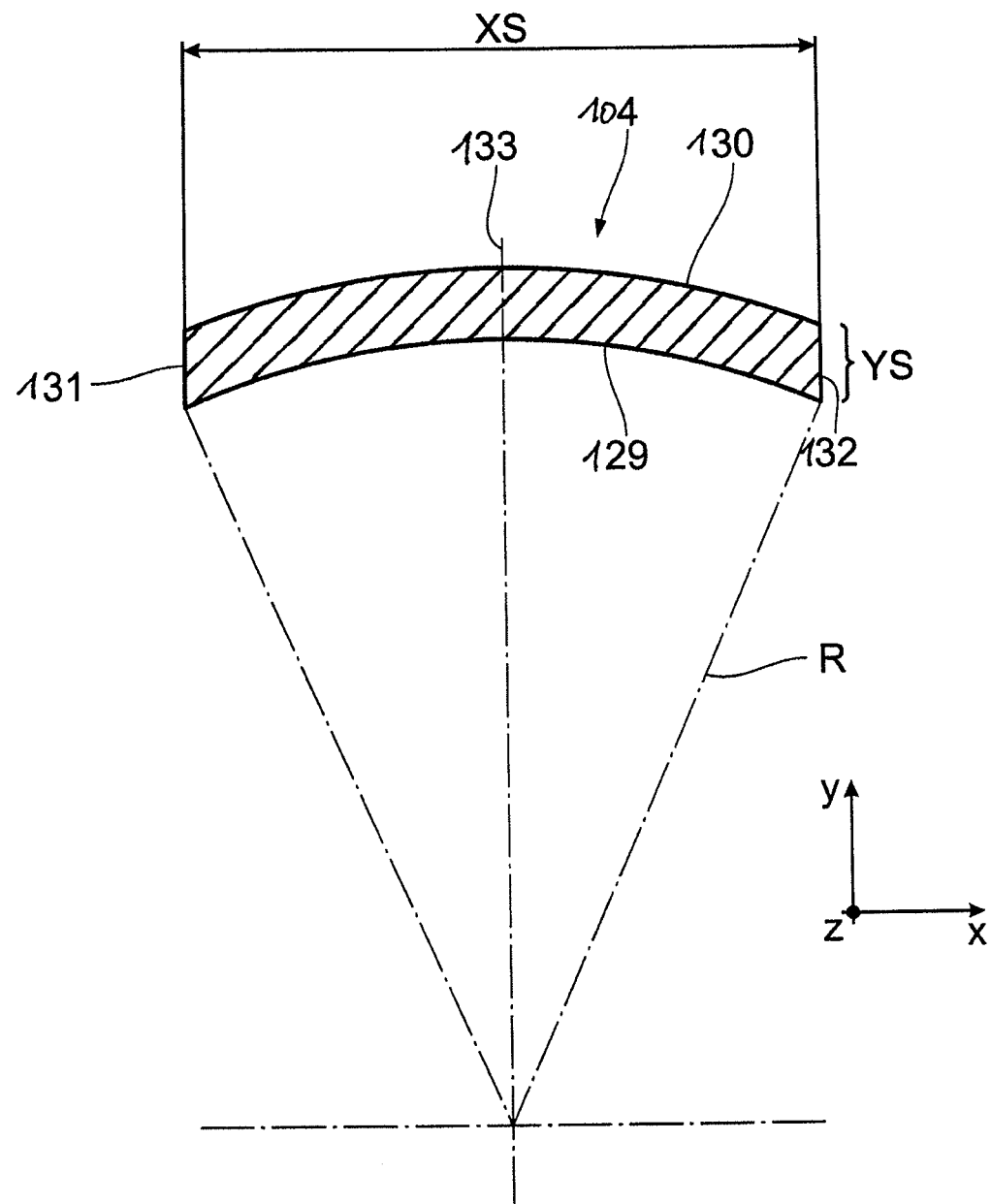
FIG. 10 depicts an object field of the imaging optics according to FIG. 6 in magnification.

FIG. 10 shows enlarged and in form of example the shape of the object field 104 of the projection objective 107. The image field 108 comprises, apart from that it is demagnified, exactly the same shape. The field 104 has the shape of an arc like field, which is limited by two divided circles 129, 130. The inner of the two divided circles, that is divided circle 129, has a radius R. Further the field 104 is limited by two borderlines 131, 132, which respectively connect the two ends of the divided circles 129, 130, and which extend further to a normal 133 extending parallel to the y-axis. The two border lines 131, 132 are distanced from each other by a distance XS, the so-called scan slit width. The two divided circles 129, 130 are distanced from each other by YS, the so-called scan slit length.

The image field 108 of the projection objective 107 according to FIG. 6 has the dimensions of XS=26 mm (scan slit width) and YS=2 mm (scan slit length). The measuring apparatus 10 according to FIG. 1 can further be configured for measuring a local distribution of an optical property over an optically effective area of the optical test object 38 instead of or in addition to measuring a deviation of a test surface 36 from its target shape. The optical property to be measured can be the refractive index, a transmission property or a reflection property of the optical test object. The measuring apparatus 10 can be configured to localize surface defects, scratches and/or dirt patches on the surface 36 of the test object 38 by evaluating the measured local distribution of the optical property. Further, the optical property can be a polarization property of the surface 36 of the test object 38 in case polarized light is used as the electromagnetic radiation 14.

When operating the measuring apparatus 10 to measure a local distribution of an optical property the incoming beam 28 is directed onto the test object 38 to generate the measuring beam 34 having interacted with the test object 38. The interaction with the test object can be in form of a reflection of the incoming beam 28 on the surface 36 of the test object 38 or in form of a transmission of the incoming beam 28 through the test object 38. In the latter case, a reflector can be arranged behind the test object 38 to reflect the beam back to the test object 38 to be transmitted by the same again in opposite direction. The resulting measuring beam 34a in this case has interacted twice with the test object 38.

The interaction with the test object 38 in any case causes the cross-sectional intensity distribution of the beam to be altered. The aberrations accumulated by the measuring beam at the optical interferometer surfaces $S_1$ to $S_9$ differ from fictitious aberrations, which would have been accumulated by the measuring beam in case of the cross-sectional intensity distribution remaining unaltered by the interaction with the test object. The fictitious aberrations accumulated at the interferometer surfaces $S_2$ to $S_9$ correspond to the aberrations accumulated by the reference beam 30. The difference between the aberrations actually accumulated by the measuring beam and the fictitious aberrations causes an error in the wave front deviation.

The error is determined analogously to the algorithms presented above with respect of the determining of the retrace error. From the determined error the local distribution of the optical property over the optically effective area of the test object is determined. This way the local distribution of the refractive index, the transmission or the reflection property over an optically effective area of the test object is determined. Therefrom surface defects, scratches and/or dirt patches on a surface of the test object can be localized. In case of the use of polarized radiation 14, a local distribution of the polarization property of the test surface can be determined.

In a further exemplary embodiment the measured wave front deviation distribution is corrected by eliminating the above error and determining a deviation of the optical test surface from its target shape from the corrected wave front deviation.

The present invention has been described by way of exemplary embodiments to which it is not limited. Variations and modifications will occur to those skilled in the art without departing from the scope of the present invention as recited in the appended claims and equivalents thereof.

What is claimed is:

1. A method of measuring a deviation of an optical test surface from a target shape, the method comprising:
   directing an incoming beam of electromagnetic radiation having a wavelength λ onto the test surface to generate a measuring beam that has interacted with the test surface,
   using an interferometer to perform a use measurement by superimposing a reference beam with the measuring beam to determine a wave front deviation of the measuring beam from the reference beam,
   determining a retrace error in the wave front deviation based on the use measurement, and
   correcting the wave front deviation of the use measurement by eliminating the retrace error therefrom, wherein:
   the test surface is configured such that a wave front deviation of larger than 10*λ is obtained when performing the use measurement in an optimum alignment in which the test surface and optical components of the interferometer are aligned such that the wave front deviation is minimized,
   aberrations accumulated by the measuring beam in the interferometer during the use measurement differ from fictitious aberrations that would have been accumulated by the measuring beam if the test surface were configured such that the wave front deviation obtained in the optimum alignment were smaller than λ, and the difference in the accumulated aberrations causes the retrace error in the wave front deviation, wherein:

the target shape has a deviation z from a rotationally symmetric calibration surface in the direction of an axis of symmetry of the calibration surface, and z satisfies the formula $$\frac{\partial z}{\partial x_i} < 0.5 \cdot N \cdot \lambda/D,$$

in which $x_i$ is a dimension perpendicular to the axis of symmetry, N is the number of pixels along a dimension of a camera of the interferometer configured to record an interferogram generated by the reference beam and the measuring beam having interacted with the test surface, and D is a diameter of the test surface perpendicular to the axis of symmetry.

2. The method according to claim 1, wherein the retrace error comprises a spatial cycle of less than 1 mm.

3. The method according to claim 1, wherein:

the reference beam is split off from the incoming beam in the interferometer, the remaining portion of the incoming beam travels through a measuring arm of the interferometer before interacting with the test surface, and the measuring beam travels in the optical path of the incoming beam back through the measuring arm of the interferometer and travels in the same optical path as the reference beam in the interferometer to form an interferogram on an interferometer camera.

4. A method of producing an optical element, the method comprising:

performing the method according to claim 1 to measure the deviation of the optical surface of the optical element from the target shape, and mechanically processing the optical surface in order to eliminate the determined deviation.

5. The method according to claim 1, wherein all single rays of the incoming beam impinge perpendicularly onto the calibration surface and the calibration surface has an aspherical shape.

6. An apparatus for measuring a deviation of an optical test surface from a target shape, the apparatus comprising:

an interferometer comprising a measurement arm that directs an incoming beam of electromagnetic radiation having a wavelength $\lambda$ onto the test surface to generate a measuring beam that has interacted with the test surface, wherein the interferometer performs an interferometric use measurement by superimposing a reference beam with the measuring beam to determine a wave front deviation of the measuring beam from the reference beam, and an evaluation device that determines a retrace error and corrects the measured wave front deviation by eliminating the retrace error therefrom, wherein:

the retrace error is generated when the test surface is configured such that a wave front deviation of larger than 10*$\lambda$ is obtained when performing the interferometric measurement in an optimum alignment in which the test surface and optical components of the interferometer are aligned such that the wave front deviation is minimized, aberrations accumulated by the measuring beam in the interferometer during the use measurement differ from fictitious aberrations that would have been accumulated by the measuring beam if the test surface were configured such that the wave front deviation obtained in optimum alignment were smaller than $\lambda$, the difference in the accumulated aberrations causes the retrace error in the wave front deviation, the target shape has a deviation z from a rotationally symmetric calibration surface in the direction of an axis of symmetry of the calibration surface, and z satisfies the formula $$\frac{\partial z}{\partial x_i} < 0.5 \cdot N \cdot \lambda/D,$$

in which $x_i$ is a dimension perpendicular to the axis of symmetry, N is the number of pixels along a dimension of a camera of the interferometer configured to record an interferogram generated by the reference beam and the measuring beam having interacted with the test surface, and D is a diameter of the test surface perpendicular to the axis of symmetry.

7. A method of measuring a deviation of an optical test surface from a target shape, the method comprising:

directing an incoming beam of electromagnetic radiation having a wavelength $\lambda$ onto the test surface to generate a measuring beam that has interacted with the test surface, using an interferometer to perform a use measurement by superimposing a reference beam with the measuring beam to determine a wave front deviation of the measuring beam from the reference beam, determining a retrace error in the wave front deviation based on the use measurement, and correcting the wave front deviation of the use measurement by eliminating the retrace error therefrom, wherein:

the test surface is configured such that a wave front deviation of larger than 10*$\lambda$ is obtained when performing the use measurement in an optimum alignment in which the test surface and optical components of the interferometer are aligned such that the wave front deviation is minimized, aberrations accumulated by the measuring beam in the interferometer during the use measurement differ from fictitious aberrations that would have been accumulated by the measuring beam if the test surface were configured such that the wave front deviation obtained in the optimum alignment were smaller than $\lambda$, and the difference in the accumulated aberrations causes the retrace error in the wave front deviation, wherein:

the target shape has a deviation z from a rotationally symmetric calibration surface in the direction of an axis of symmetry of the calibration surface, and z satisfies the formula $$\frac{\partial z}{\partial x_i} > 0.002 \cdot N \cdot \lambda/D,$$

in which $x_i$ is a dimension perpendicular to the axis of symmetry, N is the number of pixels along a dimension of a camera of the interferometer configured to record an interferogram generated by the reference beam and the measuring beam having interacted with the test surface, and D is a diameter of the test surface perpendicular to the axis of symmetry.

8. The method according to claim 7, wherein the test surface is a lens surface or a mirror surface.

9. The method according to claim 7, wherein the deviation of the test surface from the target shape is measured with an accuracy of less than 1 nm.

10. The method according to claim 7, wherein all single rays of the incoming beam impinge perpendicularly onto the calibration surface and the calibration surface has an aspherical shape.

11. An apparatus for measuring a deviation of an optical test surface from a target shape, the apparatus comprising:
an interferometer comprising a measurement arm that directs an incoming beam of electromagnetic radiation having a wavelength λ onto the test surface to generate a measuring beam that has interacted with the test surface, wherein the interferometer performs an interferometric use measurement by superimposing a reference beam with the measuring beam to determine a wave front deviation of the measuring beam from the reference beam, and
an evaluation device that determines a retrace error and corrects the measured wave front deviation by eliminating the retrace error therefrom, wherein:
the retrace error is generated when the test surface is configured such that a wave front deviation of larger than 10*λ is obtained when performing the interferometric measurement in an optimum alignment in which the test surface and optical components of the interferometer are aligned such that the wave front deviation is minimized,
aberrations accumulated by the measuring beam in the interferometer during the use measurement differ from fictitious aberrations that would have been accumulated by the measuring beam if the test surface were configured such that the wave front deviation obtained in optimum alignment were smaller than λ,
the difference in the accumulated aberrations causes the retrace error in the wave front deviation,
the target shape has a deviation z from a rotationally symmetric calibration surface in the direction of an axis of symmetry of the calibration surface, and
z satisfies the formula $$\frac{\partial z}{\partial x_i} > 0.002 \cdot N \cdot \lambda / D,$$

in which $x_i$ is a dimension perpendicular to the axis of symmetry, N is the number of pixels along a dimension of a camera of the interferometer configured to record an interferogram generated by the reference beam and the measuring beam having interacted with the test surface, and D is a diameter of the test surface perpendicular to the axis of symmetry.

12. A method of measuring a deviation of an optical test surface from a target shape, the method comprising:
directing an incoming beam of electromagnetic radiation having a wavelength λ onto the test surface to generate a measuring beam that has interacted with the test surface,
using an interferometer to perform a use measurement by superimposing a reference beam with the measuring beam to determine a wave front deviation of the measuring beam from the reference beam,
determining a retrace error in the wave front deviation based on the use measurement, and
correcting the wave front deviation of the use measurement by eliminating the retrace error therefrom, wherein:
the test surface is configured such that a wave front deviation of larger than 10*λ is obtained when performing the use measurement in an optimum alignment in which the test surface and optical components of the interferometer are aligned such that the wave front deviation is minimized,
aberrations accumulated by the measuring beam in the interferometer during the use measurement differ from fictitious aberrations that would have been accumulated by the measuring beam if the test surface were configured such that the wave front deviation obtained in the optimum alignment were smaller than λ, and
the difference in the accumulated aberrations causes the retrace error in the wave front deviation, wherein:
the target shape has a deviation z from a rotationally symmetric calibration surface in the direction of an axis of symmetry of the calibration surface,
gradient differences $g_x$ and $g_y$ are defined as follows:

$$g_x = \max\left(\frac{\partial z}{\partial x}\right)_j - \min\left(\frac{\partial z}{\partial x}\right)_j, \text{ and } g_y = \max\left(\frac{\partial z}{\partial y}\right)_j - \min\left(\frac{\partial z}{\partial y}\right)_j,$$

in which x and y are orthogonal dimensions perpendicular to the axis of symmetry and j signifies the pixels on the target shape, and
the target shape of the test surface fulfills the following conditions:

$g_x < 0.5 \cdot N \cdot \lambda / D$ and $g_y < 0.5 \cdot N \cdot \lambda / D$ and further $g_x > 0.002 \cdot N \cdot \lambda / D$ and/or $g_y > 0.002 \cdot N \cdot \lambda / D$, in which N is the number of pixels along a dimension of a camera of the interferometer configured to record an interferogram generated by the reference beam and the measuring beam having interacted with the test surface, and D is a diameter of the test surface perpendicular to the axis of symmetry.

13. The method according to claim 12, wherein all single rays of the incoming beam impinge perpendicularly onto the calibration surface and the calibration surface has an aspherical shape.

14. An apparatus for measuring a deviation of an optical test surface from a target shape, the apparatus comprising:
an interferometer comprising a measurement arm that directs an incoming beam of electromagnetic radiation having a wavelength λ onto the test surface to generate a measuring beam that has interacted with the test surface, wherein the interferometer performs an interferometric use measurement by superimposing a reference beam with the measuring beam to determine a wave front deviation of the measuring beam from the reference beam, and
an evaluation device that determines a retrace error and corrects the measured wave front deviation by eliminating the retrace error therefrom, wherein:
the retrace error is generated when the test surface is configured such that a wave front deviation of larger than 10*λ is obtained when performing the interferometric measurement in an optimum alignment in which the test surface and optical components of the interferometer are aligned such that the wave front deviation is minimized,
aberrations accumulated by the measuring beam in the interferometer during the use measurement differ from fictitious aberrations that would have been accumulated by the measuring beam if the test surface were configured such that the wave front deviation obtained in optimum alignment were smaller than λ,
the difference in the accumulated aberrations causes the retrace error in the wave front deviation,
the target shape has a deviation z from a rotationally symmetric calibration surface in the direction of an axis of symmetry of the calibration surface,
gradient differences $g_x$ and $g_y$ are defined as follows:

$$g_x = \max\left(\frac{\partial z}{\partial x}\right)_j - \min\left(\frac{\partial z}{\partial x}\right)_j, \text{ and } g_y = \max\left(\frac{\partial z}{\partial y}\right)_j - \min\left(\frac{\partial z}{\partial y}\right)_j,$$

in which x and y are orthogonal dimensions perpendicular to the axis of symmetry and j signifies the pixels on the target shape, and
the target shape of the test surface fulfills the following conditions:

$g_x < 0.5 \cdot N \cdot \lambda / D$ and $g_y < 0.5 \cdot N \cdot \lambda / D$ and further $g_x > 0.002 \cdot N \cdot \lambda / D$ and/or $g_y > 0.002 \cdot N \cdot \lambda / D$, in which N is the number of pixels along a dimension of a camera of the interferometer configured to record an interferogram generated by the reference beam and the measuring beam having interacted with the test surface, and D is a diameter of the test surface perpendicular to the axis of symmetry.

15. A method of measuring a deviation of an optical test surface from a target shape, the method comprising:
directing an incoming beam of electromagnetic radiation having a wavelength λ onto the test surface to generate a measuring beam that has interacted with the test surface,
using an interferometer to perform a use measurement by superimposing a reference beam with the measuring beam to determine a wave front deviation of the measuring beam from the reference beam,
determining a retrace error in the wave front deviation based on the use measurement, and
correcting the wave front deviation of the use measurement by eliminating the retrace error therefrom, wherein:
the test surface is configured such that a wave front deviation of larger than 10*λ is obtained when performing the use measurement in an optimum alignment in which the test surface and optical components of the interferometer are aligned such that the wave front deviation is minimized,
aberrations accumulated by the measuring beam in the interferometer during the use measurement differ from fictitious aberrations that would have been accumulated by the measuring beam if the test surface were configured such that the wave front deviation obtained in the optimum alignment were smaller than λ, and
the difference in the accumulated aberrations causes the retrace error in the wave front deviation, wherein:
the incoming beam is directed onto a calibration surface,
a resulting wave front deviation is measured by the interferometer for each of two different tilt positions of the calibration surface,
a long range retrace parameter G of the interferometer is established from the following formula:

$G = \Delta W / \Delta \epsilon$, in which ΔW is the difference between the measured wave front deviations for the two different tilt positions and Δϵ is the tilt angle between the two different tilt positions,
the retrace error is determined by multiplying the long range retrace parameter G by a local tilt of the test surface at the location at which the ray has interacted with the test surface, and
the local tilt is determined from a corresponding local fringe density of the interference pattern measured for the test surface.

16. The method according to claim 15, wherein:
at least one ray of the measuring beam passes through the interferometer on a deviated path, which is deviated with respect to the path taken by the ray if the optical surface were configured such that the wavefront deviation obtained in the optimum alignment were smaller than λ,
the wave front deviation measured for the test surface is a two dimensional distribution of the wave front deviation in a plane perpendicular to the propagation direction of the measuring beam,
the measuring beam interacts with several optical surfaces of the interferometer, each of which surfaces adds to the aberrations accumulated by the ray, and
a distance between the location at which the ray travelling on the deviated path through the interferometer impinges on one of the optical interferometer surfaces, and the location at which the ray would impinge if travelling on the respective undeviated path, is smaller than a minimum spatial cycle of the retrace error in the two dimensional wave front deviation distribution for each of the interferometer surfaces.

17. The method according to claim 15, wherein:
the measuring beam interacts with $S_N$ optical surfaces of the interferometer,
each of the $S_N$ optical surfaces adds to the aberrations accumulated by the measuring beam,
the test surface is consecutively arranged in M different tilt positions with $M > S_N$,
the resulting wave front distribution is measured for each tilt position, and
the respective contributions of the $S_N$ optical surfaces to the retrace error are calculated.

18. The method according to claim 17, wherein:
at least one ray of the measuring beam passes through the interferometer on a deviated path, which is deviated with respect to the path taken by the ray if the optical surface were configured such that the wavefront deviation obtained in the optimum alignment were smaller than λ,
the wave front deviation measured for the test surface is a two dimensional distribution of the wave front deviation in a plane perpendicular to the propagation direction of the measuring beam, and
a distance between the location at which the ray travelling on the deviated path through the interferometer impinges on one of the $S_N$ optical surfaces, and the location at which the ray would impinge if travelling on the respective undeviated path, is larger than a minimum spatial cycle of the retrace error introduced into the two dimensional wave front deviation distribution for each of the $S_N$ optical surfaces.

19. The method according to claim 15, wherein all single rays of the incoming beam impinge perpendicularly onto the calibration surface and the calibration surface has an aspherical shape.

20. An apparatus for measuring a deviation of an optical test surface from a target shape, the apparatus comprising:
an interferometer comprising a measurement arm that directs an incoming beam of electromagnetic radiation having a wavelength λ onto the test surface to generate a measuring beam that has interacted with the test surface, wherein the interferometer performs an interferometric use measurement by superimposing a reference beam with the measuring beam to determine a wave front deviation of the measuring beam from the reference beam, and an evaluation device that determines a retrace error and corrects the measured wave front deviation by eliminating the retrace error therefrom, wherein:

the retrace error is generated when the test surface is configured such that a wave front deviation of larger than 10*λ is obtained when performing the interferometric measurement in an optimum alignment in which the test surface and optical components of the interferometer are aligned such that the wave front deviation is minimized, aberrations accumulated by the measuring beam in the interferometer during the use measurement differ from fictitious aberrations that would have been accumulated by the measuring beam if the test surface were configured such that the wave front deviation obtained in optimum alignment were smaller than λ, the difference in the accumulated aberrations causes the retrace error in the wave front deviation, the incoming beam is directed onto a calibration surface, a resulting wave front deviation is measured by the interferometer for each of two different tilt positions of the calibration surface, a long range retrace parameter G of the interferometer is established from the following formula:

$$G = \Delta W / \Delta \epsilon,$$

in which $\Delta W$ is the difference between the measured wave front deviations for the two different tilt positions and $\Delta \epsilon$ is the tilt angle between the two different tilt positions, the retrace error is determined by multiplying the long range retrace parameter G by a local tilt of the test surface at the location at which the ray has interacted with the test surface, and the local tilt is determined from a corresponding local fringe density of the interference pattern measured for the test surface.

21. An optical element having an optical surface, wherein:

the optical surface has a target shape, which is a free form surface and cannot be described by a rotationally symmetrical function, the target shape deviates from its best fitting rotationally symmetrical surface such that a normal on each target shape element of a utilized area of the free form surface, which is configured for guiding radiation, and a normal on the respective corresponding surface element of the rotationally symmetrical surface, enclose an angle of maximum 70 μrad, and the optical surface deviates from the target shape by less than 1 nm.

22. The optical element according to claim 21, wherein the optical element is a mirror and the optical surface is a reflective surface of the mirror.

23. The optical element according to claim 21, wherein the target shape deviates from the best fitting rotationally symmetrical surface by more than the wavelength of radiation for which the optical element is configured.

24. The optical element according to claim 21, wherein the optical element is configured for use in a microlithography projection exposure tool.

25. Imaging optics comprising a projection objective for microlithography and including the optical element according to claim 21.

26. A projection exposure tool for microlighography, comprising:

the imaging optics according to claim 25, a radiation source for generating the radiation, and illumination optics for guiding the radiation onto an object field of the imaging optics.

\* \* \* \* \*

UNITED STATES PATENT AND TRADEMARK OFFICE
CERTIFICATE OF CORRECTION

PATENT NO.        : 8,269,981 B1
APPLICATION NO.   : 12/414390
DATED             : September 18, 2012
INVENTOR(S)       : Bernd Doerband and Frank Riepenhausen Page 1 of 1

It is certified that error appears in the above-identified patent and that said Letters Patent is hereby corrected as shown below:

Title Page, Item (56), Column 2, Line 6: delete "Aspeheric EWave-Front" and insert
-- Aspheric Wave-Front --

Column 3, Line 8: delete "perpendiculary" and insert -- perpendicularly --

Column 7, Line 29: delete "gad" and insert -- μrad --

Column 8, Line 13: delete "microlighography" and insert -- microlithography --

Column 9, Line 47: delete "λ," and insert -- λ --

Column 12, Line 10: delete "perpendiculary" and insert -- perpendicularly --

Column 16, Line 31: delete "$\varepsilon_x(x,y)$" and insert -- $\varepsilon_y(x,y)$ --

Column 17, Line 54: delete "minor" and insert -- mirror --

Column 32, Line 30: In Claim 26, delete "microlighography" and insert -- microlithography --

Signed and Sealed this
Twenty-ninth Day of January, 2013

David J. Kappos
*Director of the United States Patent and Trademark Office*